United States Patent
Marsh

(10) Patent No.: US 6,660,631 B1
(45) Date of Patent: *Dec. 9, 2003

(54) DEVICES CONTAINING PLATINUM-IRIDIUM FILMS AND METHODS OF PREPARING SUCH FILMS AND DEVICES

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/652,636

(22) Filed: Aug. 31, 2000

(51) Int. Cl.$^7$ ............................................. H01L 21/44
(52) U.S. Cl. .................. 438/680; 438/3; 438/239; 438/396; 438/685; 438/686; 438/681; 427/99; 427/252
(58) Field of Search ........................... 438/650, 680, 438/681, 686, 652, 685, 3, 239, 243, 250, 396; 427/99, 576, 584, 126.5, 252, 253, 250

(56) References Cited

U.S. PATENT DOCUMENTS

| | | |
|---|---|---|
| 3,839,164 A | 10/1974 | Hurst |
| 4,830,982 A | 5/1989 | Dentai et al. |
| 4,992,305 A | 2/1991 | Erbil |
| 5,096,737 A | 3/1992 | Baum et al. |
| 5,130,172 A | 7/1992 | Hicks et al. |
| 5,149,596 A | 9/1992 | Smith et al. |
| 5,187,638 A | 2/1993 | Sandhu et al. |
| 5,198,386 A | 3/1993 | Gonzalez |
| 5,220,044 A | 6/1993 | Baum et al. |
| 5,232,873 A | 8/1993 | Geva et al. |
| 5,252,518 A | 10/1993 | Sandhu et al. |
| 5,270,241 A | 12/1993 | Dennison et al. |
| 5,341,016 A | 8/1994 | Prall et al. |
| 5,354,712 A | 10/1994 | Ho et al. |
| 5,372,849 A | 12/1994 | McCormick et al. |
| 5,392,189 A | 2/1995 | Fazan et al. |
| 5,403,620 A | 4/1995 | Kaesz et al. |
| 5,464,786 A | 11/1995 | Figura et al. |
| 5,478,772 A | 12/1995 | Fazan |

(List continued on next page.)

FOREIGN PATENT DOCUMENTS

| | | |
|---|---|---|
| EP | 0 301 725 A1 | 2/1989 |
| EP | 0 770 862 | 5/1997 |
| JP | 9-162372 | 6/1997 |

OTHER PUBLICATIONS

Bhatt et al., "Novel high temperature multi–layered electrode barrier structure for high–density ferroelectric memories," *Appl. Phys. Lett.*, 71, 719–721 (1997).

(List continued on next page.)

*Primary Examiner*—Carl Whitehead, Jr.
*Assistant Examiner*—T Pham
(74) *Attorney, Agent, or Firm*—Mueting, Raasch & Gebhardt, P.A.

(57) ABSTRACT

Methods for forming platinum-iridium films, particularly in the manufacture of a semiconductor device, and devices (e.g., capacitors, integrated circuit devices, and memory cells) containing such films.

19 Claims, 17 Drawing Sheets

U.S. PATENT DOCUMENTS

| | | | |
|---|---|---|---|
| 5,480,684 | A | 1/1996 | Sandhu |
| 5,487,923 | A | 1/1996 | Min et al. |
| 5,498,562 | A | 3/1996 | Dennison et al. |
| 5,506,166 | A | 4/1996 | Sandhu et al. |
| 5,510,651 | A | 4/1996 | Maniar et al. |
| 5,520,992 | A | 5/1996 | Douglas et al. |
| 5,555,486 | A | 9/1996 | Kingon et al. |
| 5,561,307 | A | 10/1996 | Mihara et al. |
| 5,566,045 | A | 10/1996 | Summerfelt et al. |
| 5,581,436 | A | 12/1996 | Summerfelt et al. |
| 5,605,857 | A | 2/1997 | Jost et al. |
| 5,618,746 | A | 4/1997 | Hwang |
| 5,639,698 | A | 6/1997 | Yamazaki et al. |
| 5,654,222 | A | 8/1997 | Sandhu et al. |
| 5,654,224 | A | 8/1997 | Figura et al. |
| 5,661,115 | A | 8/1997 | Sandhu |
| 5,663,088 | A | 9/1997 | Sandhu et al. |
| 5,679,225 | A | 10/1997 | Pastacaldi et al. |
| 5,691,009 | A | 11/1997 | Sandhu |
| 5,696,384 | A | 12/1997 | Ogi et al. |
| 5,717,250 | A | 2/1998 | Schuele et al. |
| 5,728,626 | A | 3/1998 | Allman et al. |
| 5,744,832 | A | 4/1998 | Wolters et al. |
| 5,760,474 | A | 6/1998 | Schuele |
| 5,790,366 | A | 8/1998 | Desu et al. |
| 5,962,716 | A | 10/1999 | Uhlenbrock et al. |
| 5,970,378 | A | 10/1999 | Shue et al. |
| 5,972,105 | A | 10/1999 | Yamazaki et al. |
| 5,990,559 | A | 11/1999 | Marsh |
| 6,046,469 | A | 4/2000 | Yamazaki et al. |
| 6,074,945 | A | 6/2000 | Vaartstra et al. |
| 6,127,257 | A | 10/2000 | Pintchovski et al. |
| 6,133,159 | A | 10/2000 | Vaartstra et al. |
| 6,201,271 | B1 | 3/2001 | Okutoh et al. |
| 6,218,297 | B1 | 4/2001 | Marsh |
| 6,239,028 | B1 | 5/2001 | Vaartstra |
| 6,271,131 | B1 | 8/2001 | Uhlenbrock et al. |
| 6,278,146 | B1 * | 8/2001 | Nakamura ............ 257/295 |
| 6,329,286 | B1 | 12/2001 | Vaartstra |
| 2001/0007793 | A1 * | 7/2001 | Vaartstra ............ 438/686 |

OTHER PUBLICATIONS

Cohan et al., "Laser–assisted organometallic chemical vapor deposition of films of rhodium and iridium," *Appl. Phys. Lett.*, 60, 1402–1403 (1992).

Doppelt et al., "Mineral precursor for chemical vapor deposition of Rh metallic films," *Mater. Sci. Eng.*, 817, 143–146 (1993).

Etspuler et al., "Deposition of Thin Rhodium Films by Plasma–Enhanced Chemical Vapor Deposition," *Appl. Phys. A*, 48, 373–375 (1989).

Green et al., "Chemical Vapor Deposition of Ruthenium and Ruthenium Dioxide Films," *J. Electrochem. Soc.*, 132, 2677–2685 (1985).

Hoke et al., "Low–temperature Vapour Deposition of High–purity Iridium Coatings from Cyclooctadiene Complexes of Iridium," *J. Mater. Chem.*, 1, 551–554 (1991).

Hsu et al., "Synthesis and X–ray structure of the heteronuclear cluster, $(\mu–H)_2(\eta^5–C_5H_5(IrOs_3(CO)_{10},$" *Journal of Organometallic Chemistry*, 426, 121–130 (1992).

Johnson et al., "Chemistry," *Nature*, 901–902 (1967).

Kaesz et al., "Low–Temperature Organometallic Chemical Vapor Deposition of Transition Metals," *Mat. Res. Soc. Symp. Proc.*, 131, 395–400 (1989).

Khakani et al., "Pulsed laser deposition of highly conductive iridium oxide thin films," *Appl. Phys. Lett.*, 69, 2027–2029 (1991).

Kumar et al., "New precursors for organometallic chemical vapor deposition of rhodium," *Can. J. Chem.*, 69, 108–110 (1991).

Liao et al., "Characterization of $RuO_2$ thin films deposited on Si by metal–organic chemical vapor deposition," *Thin Solid Films*, 287, 74–79 (1996).

Lu et al., "Ultrahigh vacuum chemical vapor deposition of rhodium thin films on clean and $TiO_2$–covered Si(111)," *Thin Solid Films*, 208, 172–176 (1992).

Macchioni et al., "Cationic Bis–and Tris($\eta$2–(pyrazol–1–y1)methane) Acetyl Complexes of Iron (II) and Ruthenium (II): Synthesis, Characterization, Reactivity, and Interionic Solution Structure by NOESY NMR Spectroscopy," *Organometallics*, 16, 2139–2145 (1997).

Macomber et al., "The Synthesis and $^1$H NMR Study of Vinyl Organometallic Monomers: $(\eta^5C_5H_4CH=CH_2)M(CO)_2(NO)$ (M = Cr, Mo, W) and $(\eta^5–C_5H_4CH=CH_2)M(CO)_2$ (M = Co, Rh, Ir)," *Journal of Organometallic Chemistry*, 250, 311–318 (1983).

Niemer, B., et al., "Organometallic chemical vapor deposition of tungsten metal and suppression of carbon incorporation by codeposition of platinum," *Appl. Phys. Lett.*, 61 (15):1793–1795 (1992).

Pathangey et al., "Various approaches have been explored to obtain atomic layer controlled growth, but one of the most straightfoward growth techniques is molecular beam epitaxy (MBE)," *Vacuum Technology and Coating*, 33–41 (May 2000).

Rausch et al., "Isolation and Structural Characterization of Bis($\eta^5$–cyclopentadienyl)bis(carbonyl)–$\mu$–(o–phenylene)–diiridium (Ir–Ir), $(C_5H_5)_2Ir_2(C_6H_4)$: A Product Formally Derived from the Double Oxidative Addition of Benzene to Iridium," *J. Amer. Chem. Soc.*, 99, 7870–7876 (1977).

Smith et al., "Low–Temperature Chemical Vapor Deposition of Rhodium and Iridium Thin Films," *Mat. Res. Soc. Symp. Proc.*, 168, 369–374 (1990).

Suntola, "Atomic layer epitaxy," *Thin Solid Films*, 216, 84–89 (1992).

Takasu, Y., et al., "Preparation of a novel Pt–$RuO_2$/Ti electrocatalyst by use of highly porous ruthenium oxide support prepared from $RuO_2$–$La_2O_3$/electrode," *Journal of Alloys and Compounds*, 261, 172–175 (1997).

Uchida et al., "Preparation of organoiridium compound for metalorganic chemical vapor deposition (MOCVD) of thin film of iridium or iridium oxide," (Abstract of JP 08,306, 627) *CA Selects: Chemical Vapor Deposition*, 5, 1, Abstract No. 126:89572d (1997).

Van Hemert et al., "Vapor Deposition of Metals by Hydrogen Reduction of Metal Chelates," *J. Electrochem. Soc.*, 112, 1123–1126 (1965).

Versteeg et al., "Metalorganic Chemical Vapor Deposition by Pulsed Liquid Injection Using An Ultrasonic Nozzle: Titanium Dioxide on Sapphire from Titanium (IV) Isopropoxide," *J. Am. Ceram. Soc.*, 78, 2763–2768 (1995).

* cited by examiner

DEVICES CONTAINING PLATINUM-IRIDIUM FILMS AND METHODS OF PREPARING SUCH FILMS AND DEVICES

FIELD OF THE INVENTION

This invention relates to the preparation of iridium- and platinum-containing films on substrates, particularly on semiconductor device structures.

BACKGROUND OF THE INVENTION

Films of metals and metal oxides, particularly the heavier elements of Group VIII, are becoming important for a variety of electronic and electrochemical applications. For example, high quality $RuO_2$ thin films deposited on silicon wafers have recently gained interest for use in ferroelectric memories. Many of the Group VIII metal films are generally unreactive toward metal oxides, resistant to diffusion of oxygen and silicon, and are good conductors. Oxides of certain of these metals also possess these properties, although perhaps to a different extent.

Thus, films of Group VIII metals and metal oxides, particularly the second and third row metals (e.g., Ru, Os, Rh, Ir, Pd, and Pt) have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors. Iridium oxide is of particular interest as a barrier layer because it is very conductive (30–60 $\mu\Omega$-cm) and is inherently a good oxidation barrier.

Capacitors are the basic charge storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). It is important for device integrity that oxygen and/or silicon not diffuse into or out of the dielectric material. This is particularly true for ferroelectric RAMs because the stoichiometry and purity of the ferroelectric material greatly affect charge storage and fatigue properties.

The electrodes in a DRAM cell capacitor must protect the dielectric layer from interaction with surrounding materials, including interlayer dielectrics (e.g., BPSG), and from the harsh thermal processing encountered in subsequent steps of DRAM process flow. In order to finction well as a bottom electrode, the electrode layer or layer stack acts as an effective barrier to the diffusion of oxygen and silicon. Oxidation of the underlying silicon will result in decreased series capacitance, thus degrading the cell capacitor. Platinum is one of the candidates for use as an electrode material for high dielectric capacitors.

Platinum, alone, however, is relatively permeable to oxygen. One solution is to combine (e.g., alloy) the platinum with rhodium to enhance the barrier properties of the layer. Physical vapor deposition (PVD) of a Pt—Rh alloy has been shown by H. D. Bhati et. al., "Novel high temperature multi-layer electrode barrier structure for high-density ferroelectric memories," *Applied Physics Letters*, 71, pp. 719–21 (1997), to provide an improvement over pure Pt for electrode applications. Also, physical vapor deposition (PVD) of a Pt—Ir alloy has been shown in JP 09162372.

Many storage cell capacitors are formed using high aspect ratio openings. PVD deposition (e.g., sputtering) does not deliver a layer which is sufficiently conformal for formation of an electrode within such a small high aspect ratio opening.

Thus, there is a continuing need for methods and materials for the deposition of metal-containing films, such as iridium- and platinum-containing films, which can function as barrier layers, for example, in integrated circuits, particularly in random access memory devices.

SUMMARY OF THE INVENTION

The present invention is directed to methods for forming films, particularly in the manufacture of a semiconductor device, such as a ferroelectric device, and devices (e.g., capacitors, integrated circuit devices, and memory cells) containing such films. The methods involve forming films containing both iridium and platinum on substrates, such as semiconductor substrates or substrate assemblies during the manufacture of semiconductor structures. The film can be a pure platinum-iridium film, an oxide film, a sulfide film, a sulfide film, a selenide film, a nitride film, or the like. Typically and preferably, the iridium- and platinum-containing film (i.e., platinum-iridium film) is electrically conductive. The resultant film can be used as a barrier layer or electrode in an integrated circuit structure, particularly in a memory device such as a ferroelectric memory device. The platinum-iridium film (i.e., layer) overcome some of the problems associated with the use of platinum alone as an electrode material.

In the context of the present invention, the term "metal-containing film" includes, for example, relatively pure films of iridium and platinum (typically, in the form of alloys or solid solutions), as well as mixtures or alloys with other Group VIII transition metals such as rhodium, nickel, palladium, iron, ruthenium, and osmium, metals other than those in Group VIII, metalloids (e.g., Si), or mixtures thereof. The term also includes complexes of iridium and platinum with other elements (e.g., O, N, and S).

One preferred method of the present invention involves forming a film on a substrate, such as a semiconductor substrate or substrate assembly during the manufacture of a semiconductor structure. The method includes: providing a substrate (preferably, a semiconductor substrate or substrate assembly); providing a precursor composition that includes one or more complexes of the formula:

$$L_yIrY_z, \qquad \text{(Formula I)}$$

wherein: each L group is independently a neutral or anionic ligand; each Y group is independently a pi bonding ligand selected from the group of CO, NO, CN, CS, $N_2$, $PX_3$, $PR_3$. $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group and X is a halogen; y=1 to 4; z=1 to 4; x=0 to 3; providing a precursor composition that includes one or more platinum complexes; and forming a platinum-iridium-containing film from the precursor compositions on a surface of the substrate (preferably, the semiconductor substrate or substrate assembly), wherein the platinum-iridium-containing film has the formula platinum(x):iridium(1−x), wherein x is in the range of about about 0.99 to about 0.01. Preferably, the precursor composition that includes one or more complexes of the formula $L_yIrY_z$ is the same as the precursor composition that includes one or more platinum complexes.

In certain embodiments, the process is carried out in a nonhydrogen atmosphere (i.e., an atmosphere that does not include $H_2$). In other embodiments, preferably Y and L do not include halogen atoms, and more preferably, L is not a cyclopentadienyl ligand when Y is a CO ligand. Using such methods, the complexes of Formula I are converted in some manner (e.g., decomposed thermally) and deposited on a surface to form a metal-containing film. Thus, the film is not simply a film of the complex of Formula I.

Preferably, the precursor complexes are neutral complexes and may be liquids or solids at room temperature. Typically, however, they are liquids. If they are solids, they are preferably sufficiently soluble in an organic solvent or have melting points below their decomposition temperatures such that they can be used in flash vaporization, bubbling, microdroplet formation techniques, etc. However, they may also be sufficiently volatile that they can be vaporized or sublimed from the solid state using known vapor deposition techniques including chemical vapor deposition and atomic layer deposition techniques. Thus, the precursor compositions of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material, preferably, however, there is a sufficient amount of the material that can be carried by the organic solvent into the vapor phase for chemical vapor deposition processing.

The methods described herein preferably involve the use of vapor deposition techniques such as chemical vapor deposition and atomic layer deposition, although this is not a requirement for all embodiments.

The present invention also provides a capacitor. In one embodiment, the capacitor includes: a first conductive layer; a dielectric material on at least a portion of the first conductive layer; and a second conductive on the dielectric material; wherein at least one of the first and second layers includes a vapor-deposited platinum-iridium film (i.e., a film deposited by vapor deposition methods that includes platinum and iridium, preferably in the form of an alloy). Another embodiment of a capacitor includes: a first conductive layer; a dielectric material on at least a portion of the first conductive layer; and a second conductive layer on the dielectric material; and a conductive barrier layer that includes a vapor-deposited platinum-iridium film. In this latter embodiment, preferably, the first conductive layer forms an electrode and is interposed between the dielectric material and the barrier layer. Preferably, the barrier layer is interposed between the dielectric material and the first conductive layer.

The present invention also provides an integrated circuit that includes a capacitor. In one embodiment, the capacitor includes: a first conductive layer; a dielectric material on at least a portion of the first conductive layer; and a second conductive layer on the dielectric material; wherein at least one of the first and second conductive layers includes a vapor-deposited platinum-iridium film. In another embodiment, the capacitor includes: a first conductive layer; a dielectric material on at least a portion of the first conductive layer; a second conductive layer on the dielectric material; and a conductive barrier layer that includes a vapor-deposited platinum-iridium film. In this latter embodiment, preferably, the first conductive layer forms an electrode and is interposed between the dielectric material and the barrier layer. Preferably, the barrier layer is interposed between the dielectric material and the first conductive layer.

The present invention also provides a memory cell. In one embodiment, the memory cell includes: a transistor; and a capacitor that includes a barrier layer that includes a vapor-deposited platinum-iridium film. Preferably, the capacitors are as described above.

The present invention also provides methods of fabricating capacitors. In one embodiment, a method involves: forming a first conductive layer; forming a dielectric layer on at least a portion of the first conductive layer; and forming a second conductive layer on the dielectric layer; wherein at least one of the first and second conductive layers includes a vapor-deposited platinum-iridium film. Preferably, the conductive barrier layer is formed by chemical vapor co-deposition of platinum and iridium precursor compositions. In another embodiment, a method for fabricating a capacitor involves: forming a first conductive layer; forming a dielectric layer on at least a portion of the first conductive layer; forming a second conductive layer on the dielectric layer; and forming a conductive barrier layer that includes a vapor-deposited platinum-iridium film. Preferably, the first conductive layer is interposed between the barrier layer and the dielectric layer. Preferably, the second conductive layer is interposed between the barrier layer and the dielectric layer.

In another embodiment of a method for fabricating a capacitor having a first and a second electrode, the method includes: providing a substrate; forming an insulative layer overlying a substrate; forming an opening in the insulative layer to expose the substrate; forming a conductive plug in the opening, the conductive plug forming a first portion of the first electrode of the capacitor, the conductive plug recessed below a surface of the insulative layer; forming a first conductive layer in the opening and overlying the conductive plug such that the first conductive layer is surrounded on sidewalls by the insulative layer, the first conductive layer forming a second portion of the first electrode, the first conductive layer being formed of a vapor-deposited platinum-iridium film; and forming a second conductive layer overlying the first conductive layer, the second conductive layer forming a third portion of the first electrode. Preferably, the method further includes: creating a dielectric layer on the second conductive layer, the first conductive layer substantially preventing oxidation of the dielectric layer; and creating the second electrode overlying the dielectric layer, the first and the second electrode and the dielectric layer forming the capacitor. Preferably, forming the second electrode includes sputtering an electrically conductive material to overly the dielectric layer. Preferably, forming the first conductive layer includes: admitting a platinum precursor composition to a chemical vapor deposition reaction chamber; admitting an iridium precursor composition to the chemical vapor deposition reaction chamber; and applying sufficient reaction gas to the chemical vapor deposition reaction chamber to cause co-deposition of platinum and iridium. Preferably, the method further includes planarizing the insulative layer prior to forming the conductive plug. Preferably, forming the conductive plug includes depositing in-situ doped polysilicon in the opening.

Preferably, in the methods and articles described herein, the platinum-iridium films (preferably, in the form of alloys or solid solutions) have the formula platinum(x):iridium(1−x), wherein x is in the range of about 0.99 to about 0.01. Preferably, the dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

In the methods described herein, preferably, the platinum precursor composition includes a platinum complex selected from the group consisting of $CpPt(Me)_3$, wherein Me is a methyl group and Cp is substituted or unsubstituted cyclopentadienyl, $Pt(CO)_2Cl_2$, cis-$Pt(CH_3)_2[(CH_3)NC]_2$, $(COD)Pt(CH_3)_2$, $(COD)Pt(CH_3)Cl$, $(C_5H_5)Pt(CH_3)(CO)$, $(acac)(Pt)(CH_3)_3$, $Pt(acac)_2$, $Pt(PF_3)_4$, wherein COD=1,5 cycloctadiene and acac=acetylacetonate, and mixtures thereof. More preferably, the platinum precursor composition includes $CpPt(Me)_3$, wherein Me is a methyl group and Cp is methyl cyclopentadienyl. Preferably, the platinum complexes do not include halogen atoms.

In the methods described herein, preferably the iridium precursor composition includes one or more complexes of Formula I above. More preferably, the iridium precursor has the formula: $L_yIrY_z$, wherein: each L group is independently a neutral or anionic ligand; each Y group is independently a pi bonding ligand selected from the group of CO, NO, CN, CS, $N_2$, $PR_3$, $P(OR)_3$, $AsR_3$, $As(OR)_3$, $SbR_3$, $Sb(OR)_3$, $NH_xR_{3-x}$, CNR, and RCN, wherein R is an organic group, and x=0 to 3; y=1 to 4; and z=1 to 4.

Methods of the present invention are particularly well suited for forming films on a surface of a semiconductor substrate or substrate assembly, such as a silicon wafer, with or without layers or structures formed thereon, used in forming integrated circuits. It is to be understood that methods of the present invention are not limited to deposition on silicon wafers; rather, other types of wafers (e.g., gallium arsenide wafer, etc.) can be used as well. Also, the methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

DETAILED DESCRIPTION OF THE PREFERRED EMBODIMENTS

Figure 1:
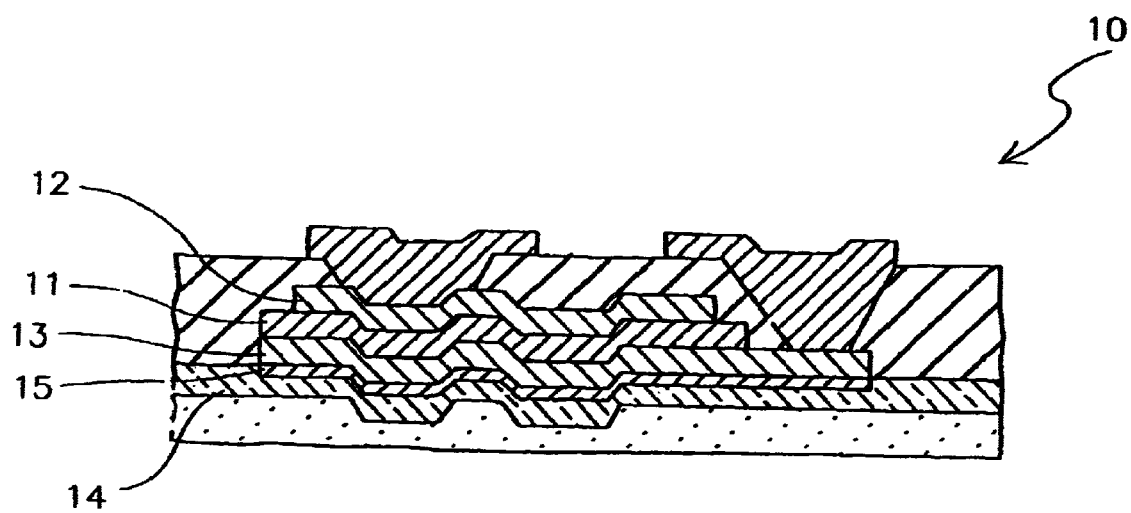
FIG. 1 is a cross-sectional schematic of a thin layer ferroelectric memory device having a conductive platinum-iridium-containing layer between the bottom electrode and underlying silicon-containing layers.

The present invention provides structures and devices containing an iridium- and platinum-containing film (i.e., layer), preferably an electrically conductive iridium- and platinum-containing film (e.g., pure iridium-platinum, an oxide, sulfide, selenide, nitride, etc.), and methods of forming these films. Specifically, the present invention is directed to methods of manufacturing a semiconductor device, particularly a ferroelectric device, having an iridium- and platinum-containing film. The iridium- and platinum-containing films formed are preferably conductive and can be used as barrier layers between the dielectric material and the silicon substrate in memory devices, such as ferroelectric memories, or as the plate (i.e., electrode) itself in the capacitors, for example. Because they are generally unreactive, such films are also suitable for use in optics applications as a reflective coating or as a high temperature oxidation barrier on carbon composites, for example. They can be deposited in a wide variety of thicknesses, depending on the desired use.

Preferred platinum-iridium films (i.e., layers) are formed on a surface of a substrate, preferably, a semiconductor substrate or substrate assembly during the manufacture of semiconductor structures. More preferably, the platinum-iridium films are formed on a silicon-containing surface. Such films may be used in the fabrication of semiconductor devices wherever it is necessary to prevent the diffusion of one material to an adjacent material. For example, in a contact structure having an opening extending to a silicon-containing surface, diffusion barriers are commonly used to prevent undesirable reactions, such as the reaction of a contact material, e.g., aluminum, with the silicon-containing surface. Also, a platinum-iridium barrier film may be used in the formation of storage cell capacitors for use in semiconductor devices such as memory devices. It may be used as an electrode or within a stack of layers forming an electrode. One skilled in the art will recognize that various semiconductor processes and structures for various devices (CMOS devices, memory devices, etc.), would benefit from the barrier characteristics of the barrier layers oft he present invention. In no manner is the present invention limited to the illustrative embodiments described herein.

A preferred platinum-iridium film according to the present invention includes an atomic composition of platinum(x):iridium(1−x), where preferably, x is in the range of about 0.01 to about 0.99. More preferably, x is in the range of about 0.65 to about 0.85, and most preferably, x is about 0.75. Preferably, the amount of iridium desired in the platinum layer to accomplish barrier characteristics for semiconductor devices is within a range of about 5 atom percent to about 30 atom percent, and more preferably, about 10 to about 20 atom percent iridium. In other words, preferably, the atomic composition of the platinum-iridium film is about 90% platinum and 10% iridium. Preferably, a platinum-iridium film (i.e., platinum-iridium layer) will have a uniform composition throughout its thickness, although this is not a necessary requirement. For example, platinum could be deposited first and then a combination of iridium and platinum could be deposited with increasing amounts of iridium as the film is formed.

The thickness of the platinum-iridium layer is dependent upon the application for which it is used. Preferably, the thickness is in the range of about 10 Angstroms to about 10,000 Angstroms. More preferably, the thickness is in the range of about 100 Angstroms to about 500 Angstroms. For example, this preferred thickness range of about 100 Angstroms to about 500 Angstroms is applicable to a single platinum-iridium layer forming an electrode of a capacitor.

The present invention also provides methods of forming a metal-containing film, preferably using one or more iridium complexes and one or more platinum complexes. These iridium and platinum complexes are typically mononuclear (i.e., monomers in that they contain one metal per molecule), although they can be in the form of weakly bound dimers (i.e., dimers containing two monomers weakly bonded together through hydrogen or dative bonds). Herein, such monomers and weakly bound dimers are shown as mononuclear complexes.

A preferred platinum-iridium film may be formed by vapor deposition from precursor compounds (typically, organometallic precursor compounds), as opposed to physical deposition (e.g., sputtering) techniques, because of the ability of these methods to form conformal layers. Such methods typically involve various forms of chemical vapor deposition (CVD), for example, atmospheric pressure chemical vapor deposition, low pressure chemical vapor deposition (LPCVD), plasma enhanced chemical vapor deposition (PECVD), or any other chemical vapor deposition technique. Another vapor deposition technique called atomic layer deposition (ALD) can also be used. This method involves the formation of a monomolecular layer of a precursor compound, which is then contacted with a reaction gas, as disclosed in *Vacuum Technology and Coating*, May 2000, page 33. A preferred deposition process includes the use of separate platinum and iridium precursors, although one compound could be envisioned to provide both metals.

A wide variety of platinum and iridium complexes suitable for deposition via CVD or ALD can be used in the process of the invention. The iridium precursor is preferably of Formula I shown below, which is shown as a monomer, although weakly bound dimers are also possible. The platinum precursor is preferably of Formula II shown below, which is shown as a monomer, although weakly bound dimers are also possible. Although these compounds are preferred, a wide variety of precursors can be used as long as they can be used in a vapor deposition process and the ligands in the compounds are subject to removal to form zero valent metal.

The iridium and platinum complexes, which are preferably of Formulae I and II below, are neutral complexes and may be liquids or solids at room temperature. Typically, they are liquids. If they are solids, they are sufficiently soluble in an organic solvent to allow for vaporization, they can be vaporized or sublimed from the solid state, or they have melting temperatures below their decomposition temperatures. Thus, many of the complexes described herein are suitable for-use in vapor deposition techniques, preferably chemical vapor deposition (CVD) techniques, such as flash vaporization techniques, bubbler techniques, and/or microdroplet techniques. Preferred embodiments of the complexes described herein are particularly suitable for low temperature CVD, e.g., deposition techniques involving substrate temperatures of about 200° C. to about 400° C.

The solvents that are suitable for this application can be one or more of the following: saturated or unsaturated linear, branched, or cyclic aliphatic (alicyclic) hydrocarbons ($C_3$–$C_{20}$, and preferably $C_5$–$C_{10}$), aromatic hydrocarbons ($C_5$–$C_{20}$, and preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitrites, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. They are also generally compatible with each other, so that mixtures of variable quantities of the complexes will not interact to significantly change their physical properties.

One preferred method of the present invention involves vaporizing a precursor composition that includes one or more iridium complexes and one or more platinum complexes, although these complexes can be provided separately. Also, the precursor composition-can include complexes containing other metals or metalloids. Preferably, for substrates that include voids or openings, it is particularly desirable to select precursor compounds having similar decomposition temperatures to enable the formation of uniform films.

The precursor composition can be vaporized in the presence of an inert carrier gas and/or a reaction gas to form a relatively pure platinum-iridium alloy film, or other platinum- and iridium-containing film. The inert carrier gas is typically selected from the group consisting of nitrogen, helium, argon, and mixtures thereof. In the context of the present invention, an inert carrier gas is one that is generally unreactive with the complexes described herein and does not interfere with the formation of an platinum- and iridium-containing film. The reaction gas can be selected from a wide variety of gases reactive with the complexes described herein, at least at a surface under the conditions of chemical vapor deposition. Examples of reaction gases include hydrogen, oxidizing gases such as $H_2O$, $H_2O_2$; $O_2$, $O_3$, $N_2O$, $SO_3$, as well as $H_2S$, $H_2Se$, $SiH_4$, $NH_3$, $N_2H_4$, $Si_2H_6$, Preferably, the reaction gas is a nonhydrogen gas (i.e., a gas that is not $H_2$). Various combinations of carrier gases and/or reaction gases can be used in the methods of the present invention to form platinum- and iridium-containing films. Thus, the platinum- and iridium-containing film can include oxygen, sulfur, nitrogen, hydrogen, selenium, silicon, or combinations thereof. Such metal-containing films can be formed by subjecting a relatively pure metal-containing film to subsequent processing, such as annealing or.rapid thermal oxidation, to form other metal-containing films, such as oxides or silicides, for example.

The iridium complex is of the following formula, which is shown as a monomer, although weakly bound dimers are also possible:

$$L_zIr_y,\quad\text{(Formula I)}$$

wherein: each L group is independently a neutral or anionic ligand; each Y group is independently a pi bonding ligand selected from the group of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group and X is a halogen; y=1 to 4 (preferably, 1); z=1 to 4 (preferably, 2 or 3, and more preferably, 2); and x=0 to 3. More preferably, the compounds of Formula I do not include halogen atoms.

Each L ligand is a neutral or anionic ligand, which can include pi bonding ligands. Preferably, L is selected from the group of dialkyl- and trialkyl-amines, polyamines (e.g., N,N,N'N'N"-pentamethyldiethylenetriamine, diethylenetriamine), trialkylphosphines, trialkylphosphites, ethers (including linear, branched, and cyclic ethers and polyethers), unsubstituted and fluoro-substituted linear, branched, and cyclic alkyls, substituted or unsubstituted linear, branched, or cyclic (alicyclic) alkenes (including monoenes, dienes, trienes, bicyclic alkenes, and polyenes, such as cyclopentadiene (Cp), cyclooctadiene, benzene, toluene, and xylene), substituted or unsubstituted linear, branched, and cyclic (alicyclic) alkynes, alkoxy groups (e.g., methoxy, ethoxy, isopropoxy), allyls, carboxylates, diketonates, thiolates, halides, substituted silanes (including alkoxy substituted silanes, alkyl substituted silanes, alkenyl substituted silanes), as well as oxo, nitrile, isonitrile, cyano, and carbonyl ligands. Various combinations of such L groups can be present in a molecule. For certain embodiments, at least two different ligands are present in each complex. Preferably, neither L nor Y include halogen atoms. More preferably, L is methylcyclopentadienyl and Y is carbonyl or nitrosyl; however, for certain embodiments, L is not a cyclopentadienyl ligand when Y is a carbonyl ligand.

Preferably, each R group in the complexes of Formula I is a ($C_1$–$C_8$) organic group. More preferably, each R group is a ($C_1$–$C_5$) organic group. Most preferably, each R group is a ($C_1$–$C_4$) alkyl moiety.

The platinum precursor is preferably a platinum complex as shown in formula II:

$$CpPt(Me)_3\quad\text{(Formula II)}$$

where Me is a methyl group and Cp is cyclopentadienyl, which may be substituted or unsubstituted (preferably, Cp is methylcyclopentadienyl). Other platinum complexes that can be used in addition or in place of the complex of Formula II include, for example, $Pt(CO)_2Cl_2$, cis-$Pt(CH_3)_2$ [$(CH_3)NC]_2$, $(COD)Pt(CH_3)_2$, $(COD)Pt(CH_3)Cl$, $(C_5H_5)Pt(CH_3)(CO)$, $(acac)(Pt)(CH_3)_3$, $Pt(acac)_2$, and $Pt(PF_3)_4$, wherein COD=1,5-cycloctadiene and acac=acetylacetonate.

For certain embodiments, the precursor compositions may be used in the range of from about 1 percent to about 99 percent of an iridium precursor, more preferably about 5 percent to about 50 percent of an iridium precursor, and most preferably, about 10 percent of Formula I (Ir precursor) and about 90 percent of Formula II (Pt precursor), wherein the percentages are based on mole percents.

As used herein, the term "organic group" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present invention, the organic groups are those that do not interfere with the formation of a metal-containing film. Preferably, they are of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Substitution is anticipated on the organic groups of the complexes of the present invention. As a means of simplifying the discussion and recitation of certain terminology used throughout this application, the terms "group" and "moiety" are used to differentiate between chemical species that allow for substitution or that may be substituted and those that do not allow or may not be so substituted. Thus, when the term "group" is used to describe a chemical substituent, the described chemical material includes the unsubstituted group and that group with O, N, Si, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

A preferred class of complexes of Formula I include $(RC_5H_4)Ir(CO)_2$, here 'R' represents one or more substituents such as methyl, ethyl, vinyl, etc. on the cyclopentadienyl group (Cp). This class of complexes of Formula I is particularly advantageous because they are liquids and can be delivered to the CVD chamber using simple bubbler techniques.

Various combinations of the complexes described herein can be used in a precursor composition. Thus, as used herein, a "precursor composition" refers to a liquid or solid that includes one or more complexes of the formulas described herein optionally mixed with one or more complexes of formulas other than those described herein. The precursor composition can also include one or more organic solvents suitable for use in a chemical vapor deposition system, as well as other additives, such as free ligands, that assist in the vaporization of the desired compounds.

The complexes described herein can be used in precursor compositions for vapor deposition techniques, preferably, chemical vapor deposition (CVD) or atomic layer deposition (ALD). Alternatively, certain complexes described herein can be used in other deposition techniques, such as sputtering, spin-on coating, and the like. Typically, those complexes containing R groups with a low number of carbon atoms (e.g., 1–4 carbon atoms per R group) are suitable for use with vapor deposition techniques. Those complexes containing R groups with a higher number of carbon atoms (e.g., 5–12 carbon atoms per R group) are generally suitable for spin-on or dip coating. Preferably, however, vapor deposition techniques are desired because they are more suitable for deposition on semiconductor substrates or substrate assemblies, particularly in contact openings which are extremely small and require conformally filled layers of metal.

For the preparation of iridium films, at least one complex of Formula I can be combined with another complex in a precursor composition. For example, $CpIr(CO)_2$ can be combined with $CpPtMe_3$ to form an Ir/Pt film.

The complexes used in the present invention can be prepared by a variety of methods known to one of skill in the art. For example, $(C_5H_5)Ir(CO)_2$ can be prepared by reaction of chlorotricarbonyl iridium(I) with cyclopentadienyllithium in THF solvent, and $MeCpPtMe_3$ is commercially available from Strem Chemicals.

As stated above, the use of the iridium complexes and platinum complexes and methods of forming conductive platinum- and iridium-containing films of the present invention are beneficial for a wide variety of thin film applications in integrated circuit structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a film formed from the complexes of the present invention would be useful is the ferroelectric memory cell 10 of FIG. 1. The memory cell 10 includes a ferroelectric material 11, such as a lead zirconate titanate (PZT) or lithium niobate film, between two electrodes 12 and 13, which are typically made of platinum, although other metals such as gold or aluminum can also be used. The bottom electrode 13 is typically in contact with a silicon-containing layer 14, such as an n-type or p-type silicon substrate, silicon dioxide, glass, etc. A conductive platinum-iridium layer 15 prepared from a complex of Formula I is positioned between the bottom electrode 13 and the silicon-containing layer 14 to act as a barrier to diffusion of atoms such as silicon into the electrode and ferroelectric material. Alternatively, or additionally, the two electrodes can be made of platinum-iridium.

Methods of the present invention can be used to deposit a metal-containing film, preferably a metal alloy film, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The film is deposited upon decomposition (typically, thermal decomposition) of an iridium complex of Formula I (preferably, in combination with a platinum complex), preferably,one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

Figure 2:
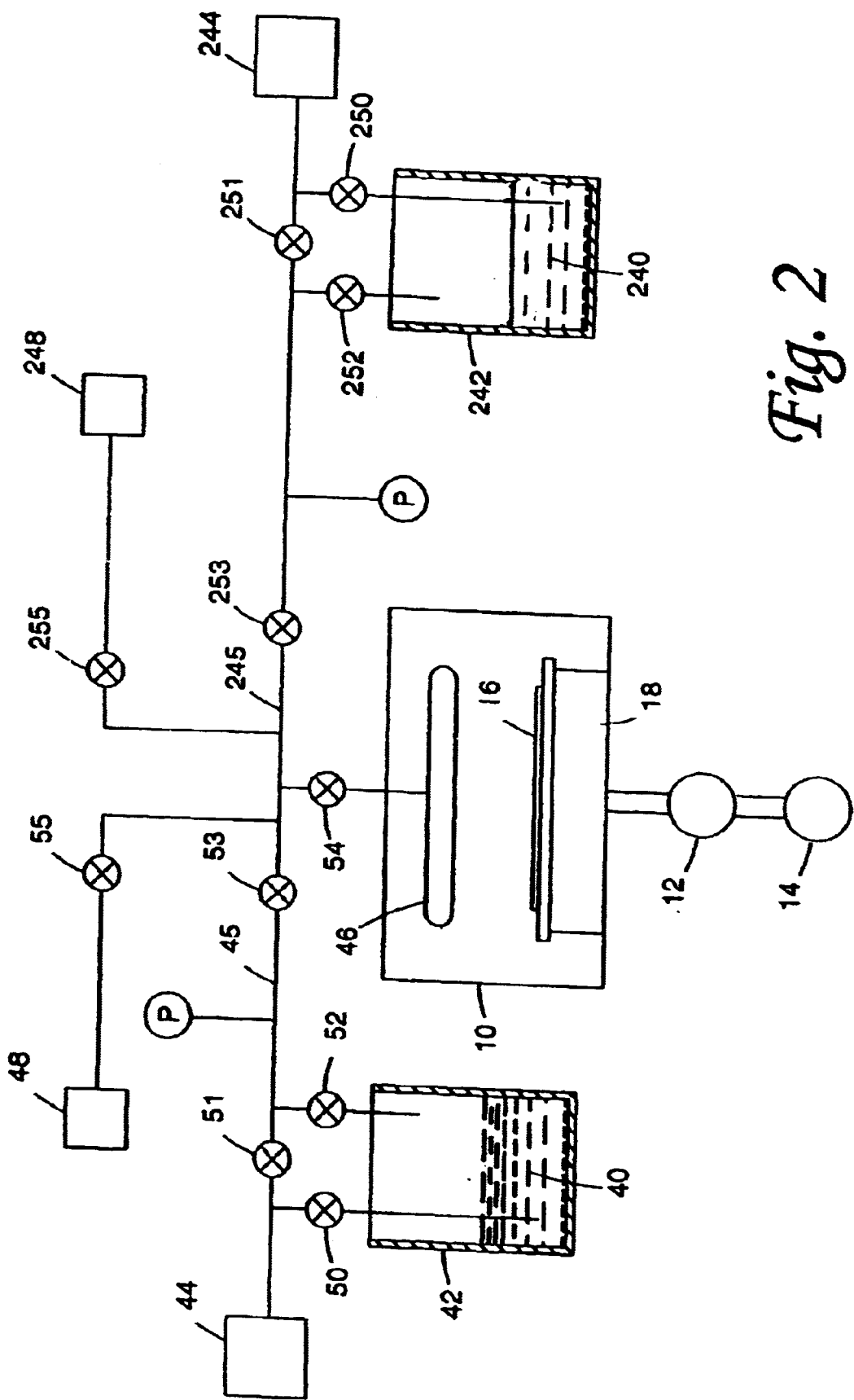
FIG. 2 is a schematic of a chemical vapor deposition system suitable for use in the method of the present invention.

A typical chemical vapor deposition (CVD) system that can be used to perform the process of the present invention is shown in FIG. 2. The system includes an enclosed chemical vapor deposition chamber 10; which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 10 using turbo pump 12 and backing pump 14.

One or more substrates 16 (e.g., semiconductor substrates or substrate assemblies) are positioned in chamber 10. A constant nominal temperature is established for the substrate, preferably at a temperature of about 100° C. to about 600° C., and more preferably at a temperature of about 200° C. to about 400° C. Substrate 16 may be heated, for example, by an electrical resistance heater 18 on which substrate 16 is mounted. Other known methods of heating the substrate may also be utilized.

In this process, if only one precursor composition is used, the precursor composition 40, which contains one or more iridium complexes (and/or other metal or metalloid complexes), is stored in liquid form (a neat liquid at room temperature or at an elevated temperature if solid at room temperature) in vessel 42. A source 44 of a suitable inert gas is pumped into vessel 42 and bubbled through the neat liquid (i.e., without solvent) picking up the precursor composition and carrying it into chamber 10 through line 45 and gas distributor 46. Additional inert carrier gas or reaction gas may be supplied from source 48 as needed to provide the desired concentration of precursor composition and regulate the uniformity of the deposition across the surface of substrate 16. Valves 50–55 are opened and closed as required.

If two precursor compositions are used in this process, such as when a platinum-iridium film is formed, the precursor composition 240, which contains one or more platinum complexes (and/or other metal or metalloid complexes), is stored in liquid form (a neat liquid at room temperature or at an elevated temperature if solid at room temperature) in vessel 242. A source 244 of a suitable inert gas is pumped into vessel 242 and bubbled through the neat liquid (i.e., without solvent) picking up the precursor composition and carrying it into chamber 10 through line 245 and gas distributor 46. Additional inert carrier gas or reaction gas may be supplied from source 248 as needed to provide the desired concentration of precursor composition and regulate the uniformity of the deposition across the surface of substrate 16. Valves 250–253 and 255 are opened and closed as required.

Preferably, for the preparation of a platinum-iridium film, within the reaction chamber, the partial pressure of iridium precursor gas is kept sufficiently low such that the iridium deposited is within the ranges described herein for forming the preferred composition of the film. This partial pressure may be controlled by controlling the flow of the carrier gas, e.g., helium, through the bubbler containing the iridium precursor or through control of other parameters of the process, such as temperature and pressure of the bubbler.

Generally, the precursor composition or compositions, and optional reaction gases, are pumped into the CVD chamber 10 at a flow rate of about 1 sccm (standard cubic centimeters) to about 1000 sccm. The semiconductor substrate is exposed to the precursor composition at a pressure of about 0.001 torr to about 100 torr for a time of about 0.01 minute to about 100 minutes. In chamber 10, the precursor composition will form an adsorbed layer on the surface of the substrate 16. As the deposition rate is temperature dependent in a certain temperature range, increasing the temperature of the substrate will increase the rate of deposition. Typical deposition rates are about 10 Angstroms/minute to about 1000 Angstroms/minute. The carrier gas containing the precursor composition(s) is terminated by closing valve 53 (and 253).

Figure 3:
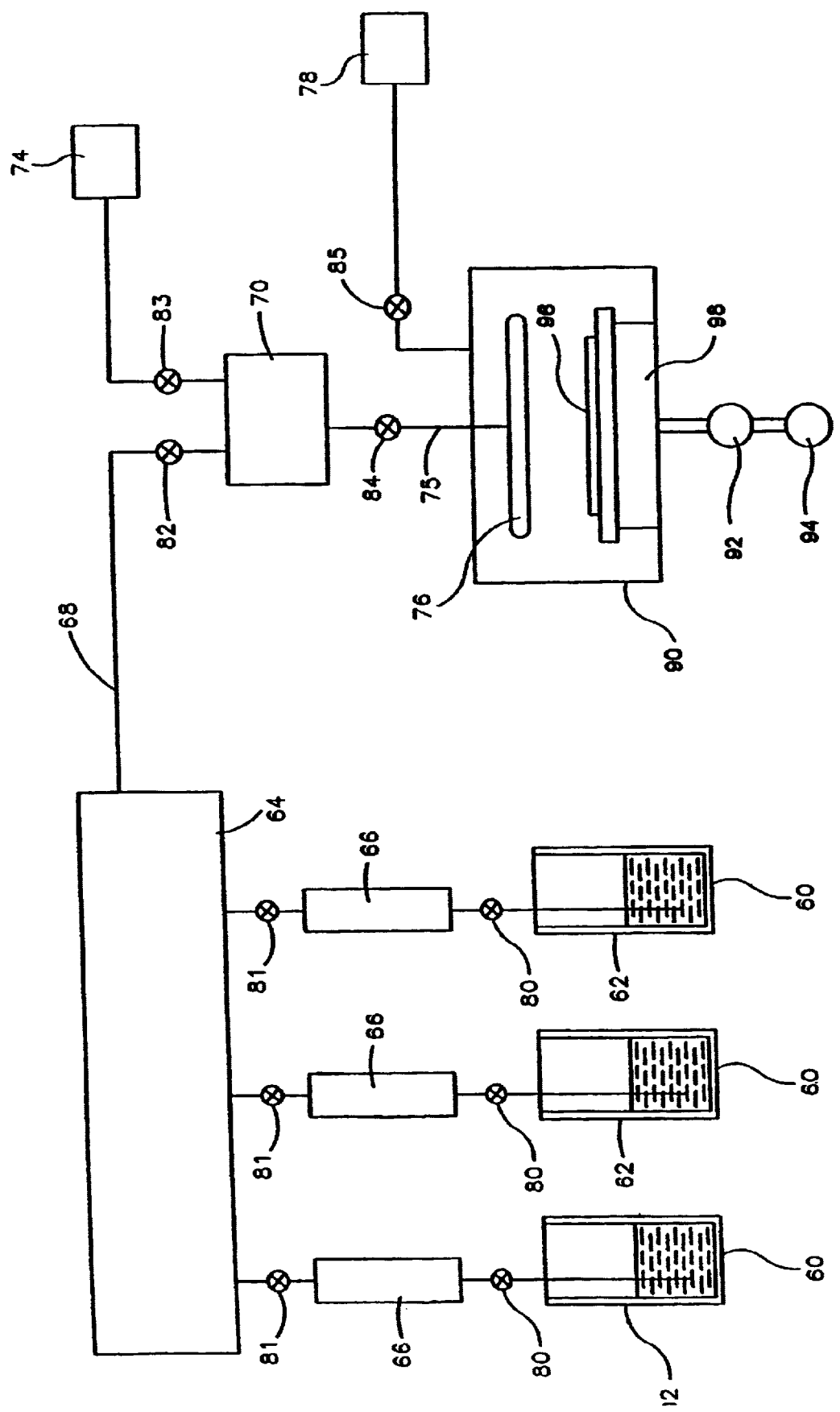
FIG. 3 is a schematic of an alternative chemical vapor deposition system suitable for use in the method of the present invention.

An alternative CVD system that can be used to perform the process of the present invention is shown in FIG. 3. The system includes an enclosed chemical vapor deposition chamber 90, which may be a cold wall-type CVD reactor, in which a vacuum may be created using turbo pump 92 and backing pump 94. One or more substrates 96 (e.g., semiconductor substrates or substrate assemblies) are positioned in chamber 90. Substrate 96 may be heated as described with reference to FIG. 2 (for example, by an electrical resistance heater 98).

In this process, one or more solutions 60 of one or more precursor iridium and precursor platinum complexes (and/or other metal or metalloid complexes) are stored in vessels 62. The solutions are transferred to a mixing manifold 64 using pumps 66. The resultant precursor composition (or compositions) containing one or more precursor complexes and one or more organic solvents is then transferred along line 68 to vaporizer 70, to volatilize the precursor composition. A source 74 of a suitable inert gas is pumped into vaporizer 70 for carrying volatilized precursor composition into chamber 90 through line 75 and gas distributor 76. Reaction gas may be supplied from source 78 as needed. As shown, a series of valves 80–85 are opened and closed as required. Similar pressures and temperatures to those described with reference to FIG. 2 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes described herein are also particularly well suited for use with vapor deposition systems as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition.

Although specific vapor deposition processes are described by reference to the figures, methods of the present invention are not limited to being used with the specific vapor deposition systems shown. Various vapor deposition process chambers or reaction chambers can be used, including hot wall or cold wall reactors, atmospheric or reduced pressure reactors, as well as plasma enhanced reactors. Furthermore, methods of the present invention are not necessarily limited to any specific vapor deposition techniques.

A specific example of a fabrication process for a capacitor according to one embodiment of the present invention is described below. It is to be understood, however, that this process is only one example of many possible configurations and processes utilizing the iridium-containing layers (e.g., Pt—Ir barriers or electrodes) of the invention. For example, in the process described below, a Pt—Ir material (preferably, alloy) is utilized as a barrier below the bottom electrode of a capacitor. Alternatively, the top electrode may also include a Pt—Ir barrier material.

Furthermore, doped poly or other conventional electrode materials may be provided with a Pt—Ir layer atop the electrode, between the electrode and the dielectric, in both locations, or the Pt—Ir material itself may form one or both electrodes in lieu of conventional electrode materials. In addition, in the process described below the bit line is formed over the capacitor. A buried bit-line process could also be used. As another example, the plugs under the capacitors formed by the following process could be eliminated. Also, dry or wet etching could be used rather than chemical mechanical polishing. The invention is not intended to be limited by the particular process described below.

Figure 4:
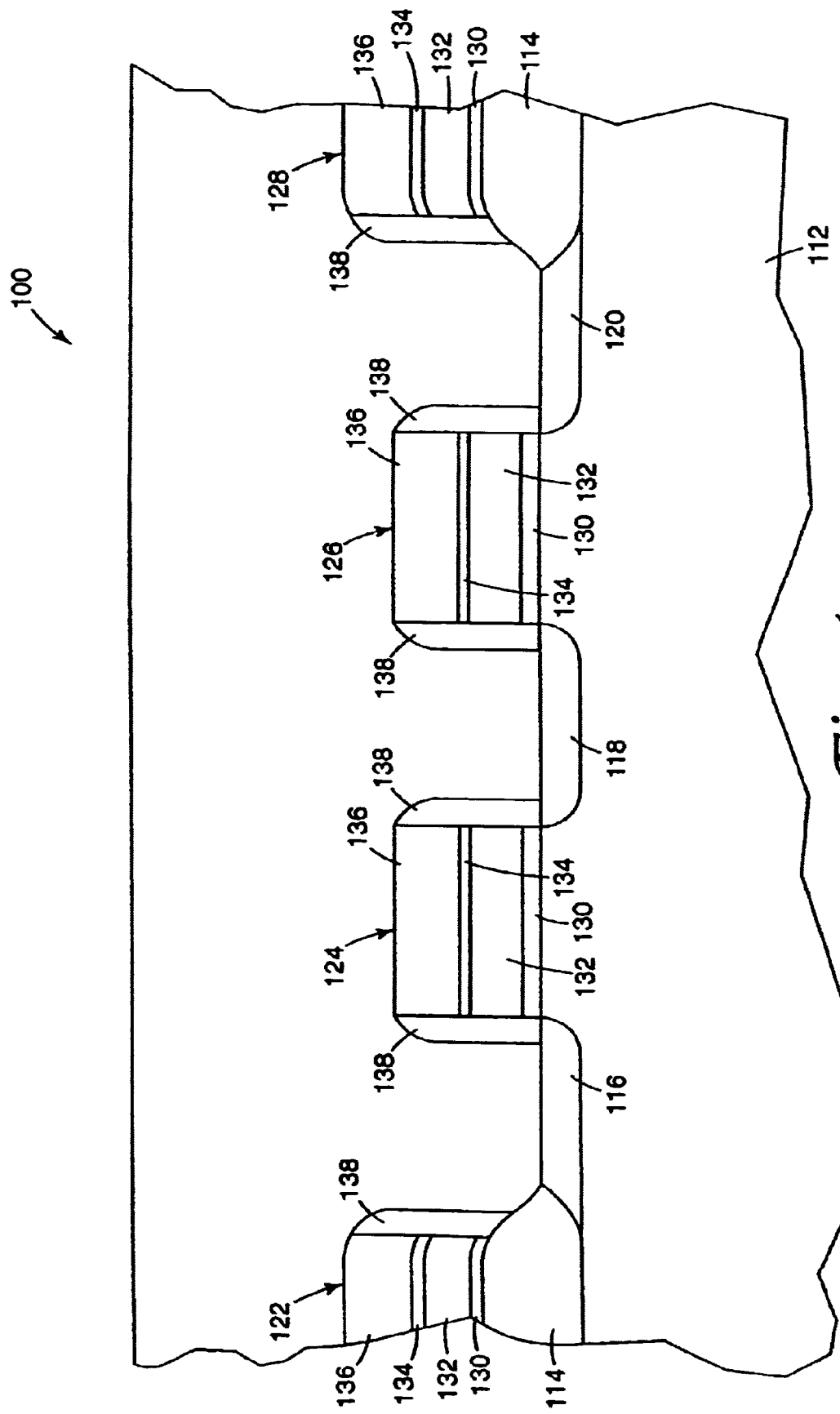
FIG. 4 is a diagrammatic cross-sectional view taken along a portion of a semiconductor wafer at an early processing step according to one embodiment of the present invention.

Referring to FIG. 4, a semiconductor wafer fragment at an early processing step is indicated generally by reference numeral 100. The semiconductor wafer 100 includes a bulk silicon substrate 112 with field isolation oxide regions 114 and active areas 116, 118, 120. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, also of silicon nitride.

Two FETs are depicted in FIG. 4. One FET includes two active areas (source/drain) 116, 118 and one word line (gate) 124. The second FET includes two active areas (source/drain) 118, 120 and a second word line (gate) 126. The active area 118 common to both FETs is the active area over which a bit line contact will be formed.

Figure 5:
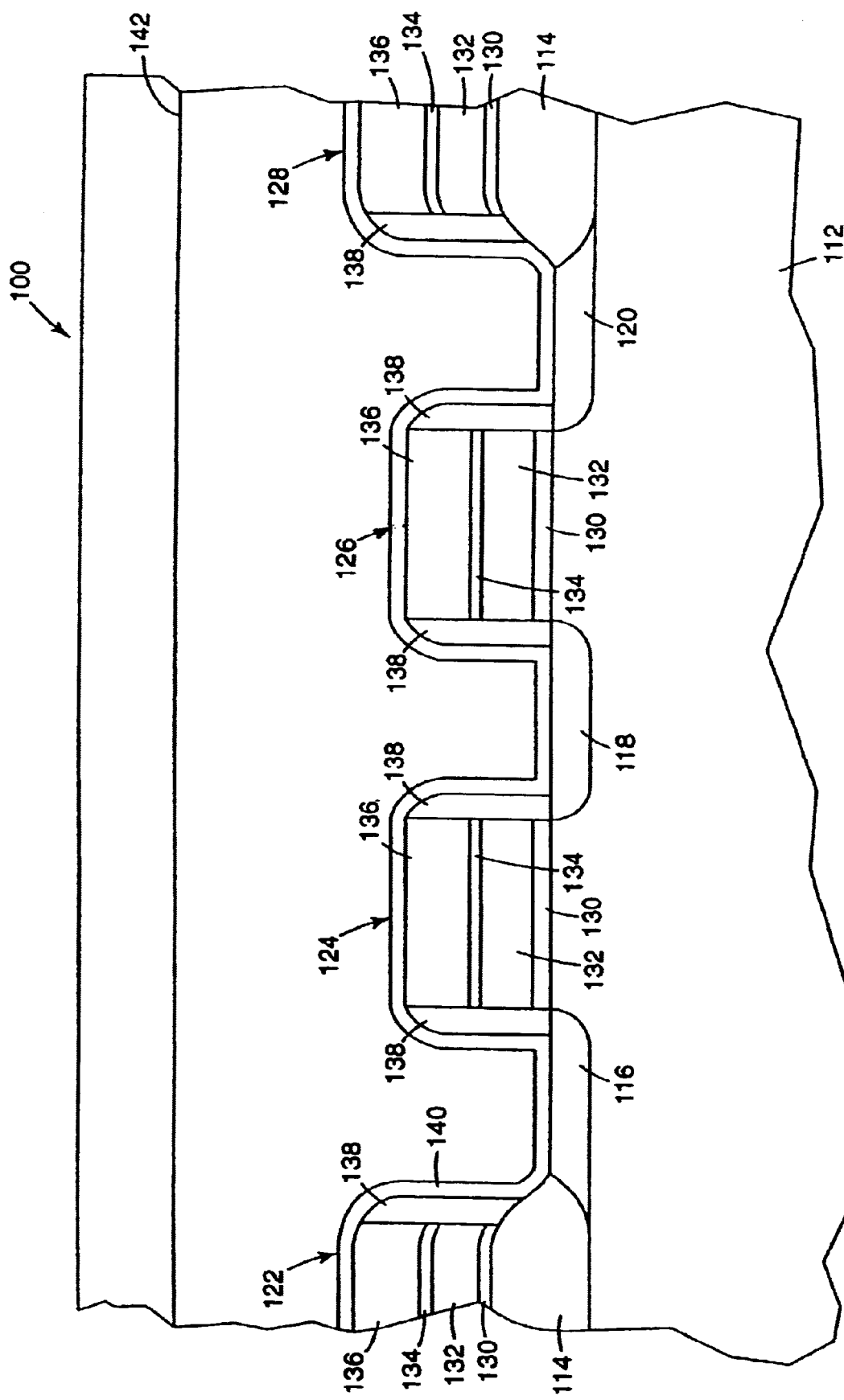
FIG. 5 is a diagrammatic cross-sectional view of a portion of a semiconductor wafer at a processing step subsequent to that shown in FIG. 4.

Referring to FIG. 5, a thin film 140 of nitride or TEOS is provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 6:
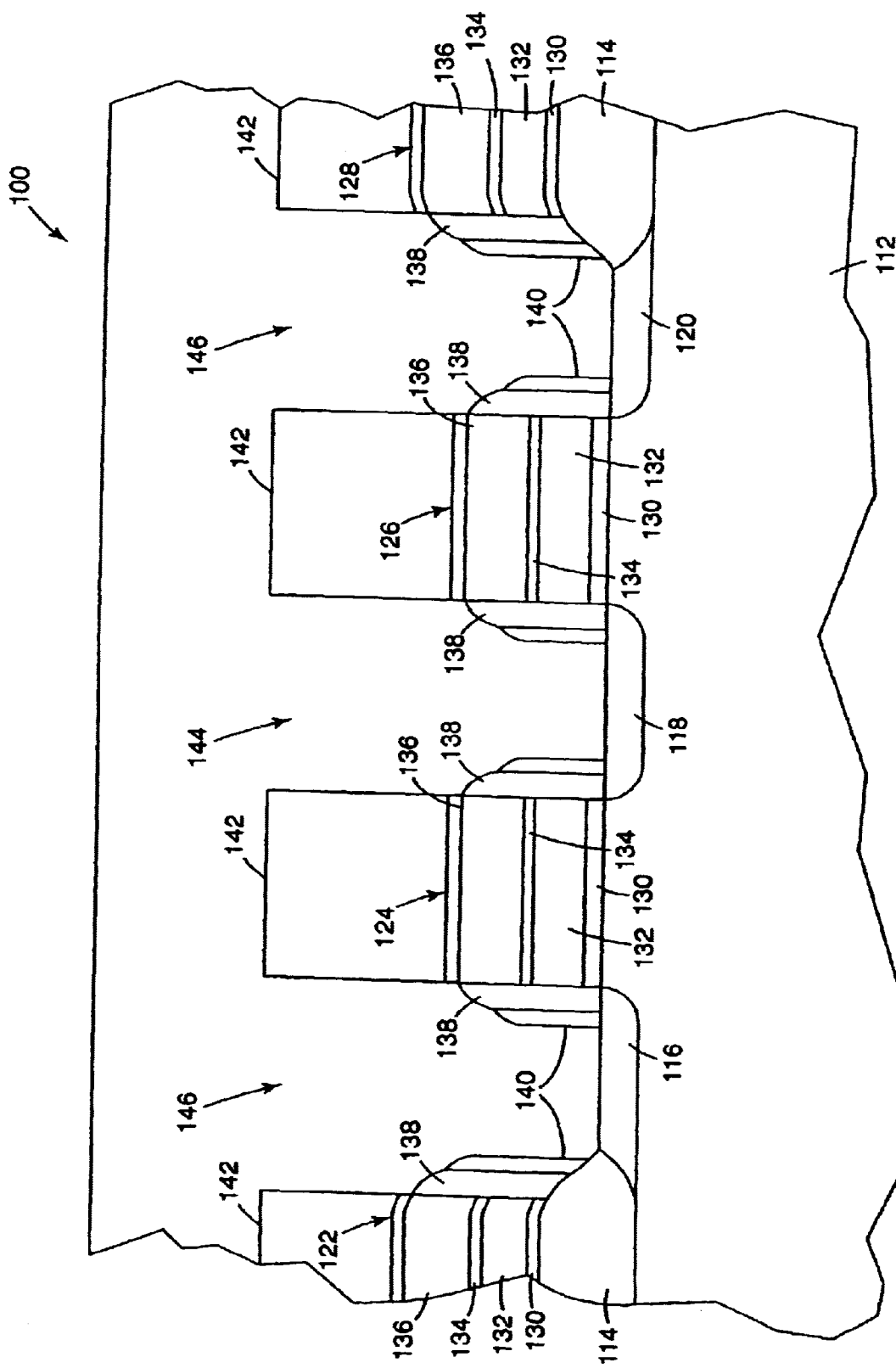
FIG. 6 is a diagrammatic cross-sectional view of a portion of a semiconductor wafer at a processing step subsequent to that shown in FIG. 5.
Figure 7:
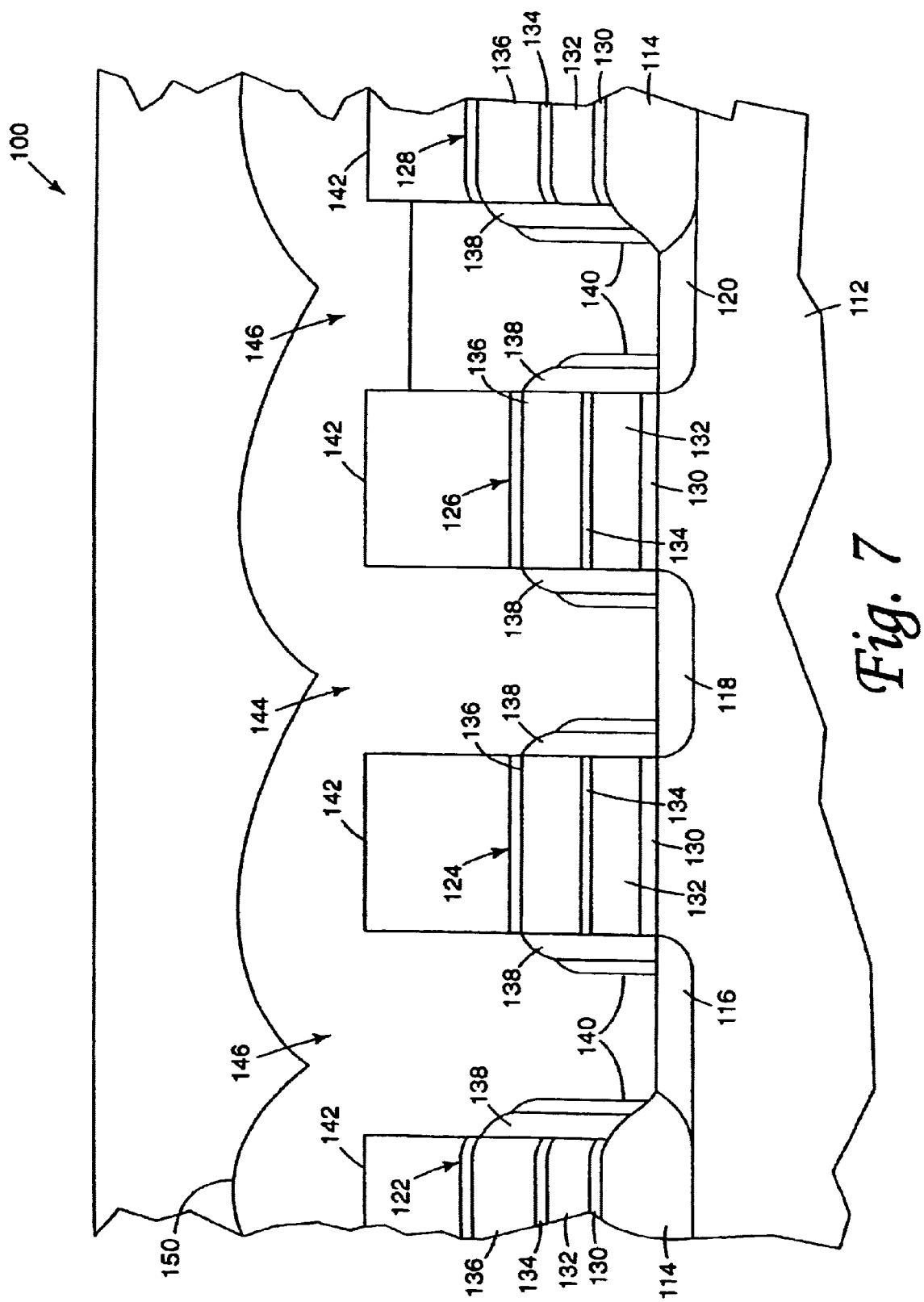
FIG. 7 is a diagrammatic cross-sectional view of a portion of a semiconductor wafer at a processing step subsequent to that shown in FIG. 6.
Figure 8:
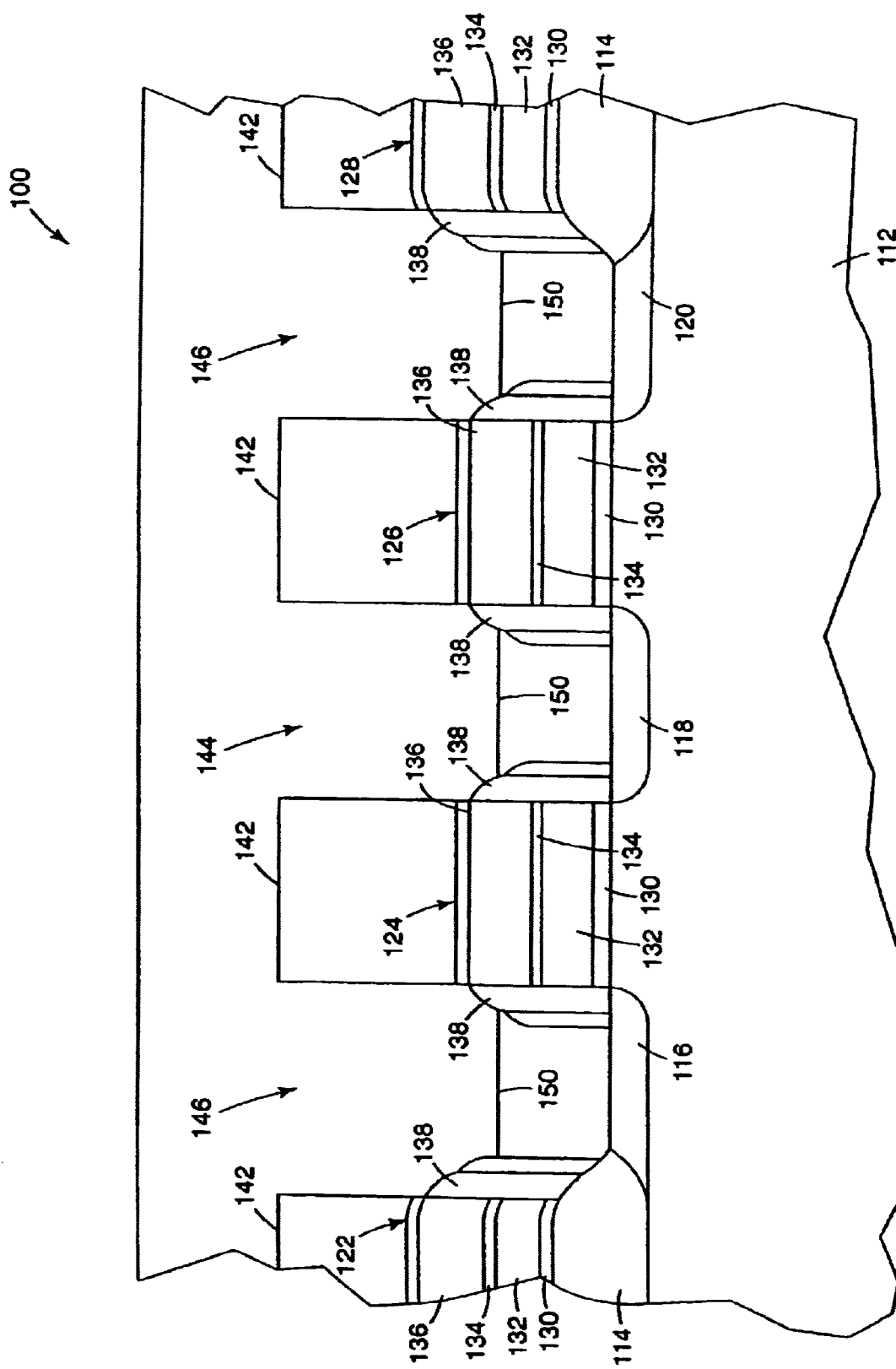
FIG. 8 is a diagrammatic cross-sectional view of a portion of a semiconductor wafer at a processing step subsequent to that shown in FIG. 7.

Referring to FIG. 6, a bit line contact opening 144 and capacitor openings 146 have been formed through the insulating layer 142. The openings 144, 146 are formed through the insulating layer 142 by photomasking and dry chemical etching the BPSG relative to the thin nitride or TEOS layer 140. Referring now to FIG. 7, a layer 150 of conductive material is deposited to provide conductive material within the bit line contact opening 144 and capacitor openings 146. The conductive layer 150 is in contact with the active areas 116, 118, 120. An example of the material used to form layer 150 is in situ arsenic or phosphorous doped poly. Referring now to FIG. 8, the conductive layer 150 is etched away to the point that the only remaining material forms plugs 150 over the active areas 116, 118, 120.

Figure 9:
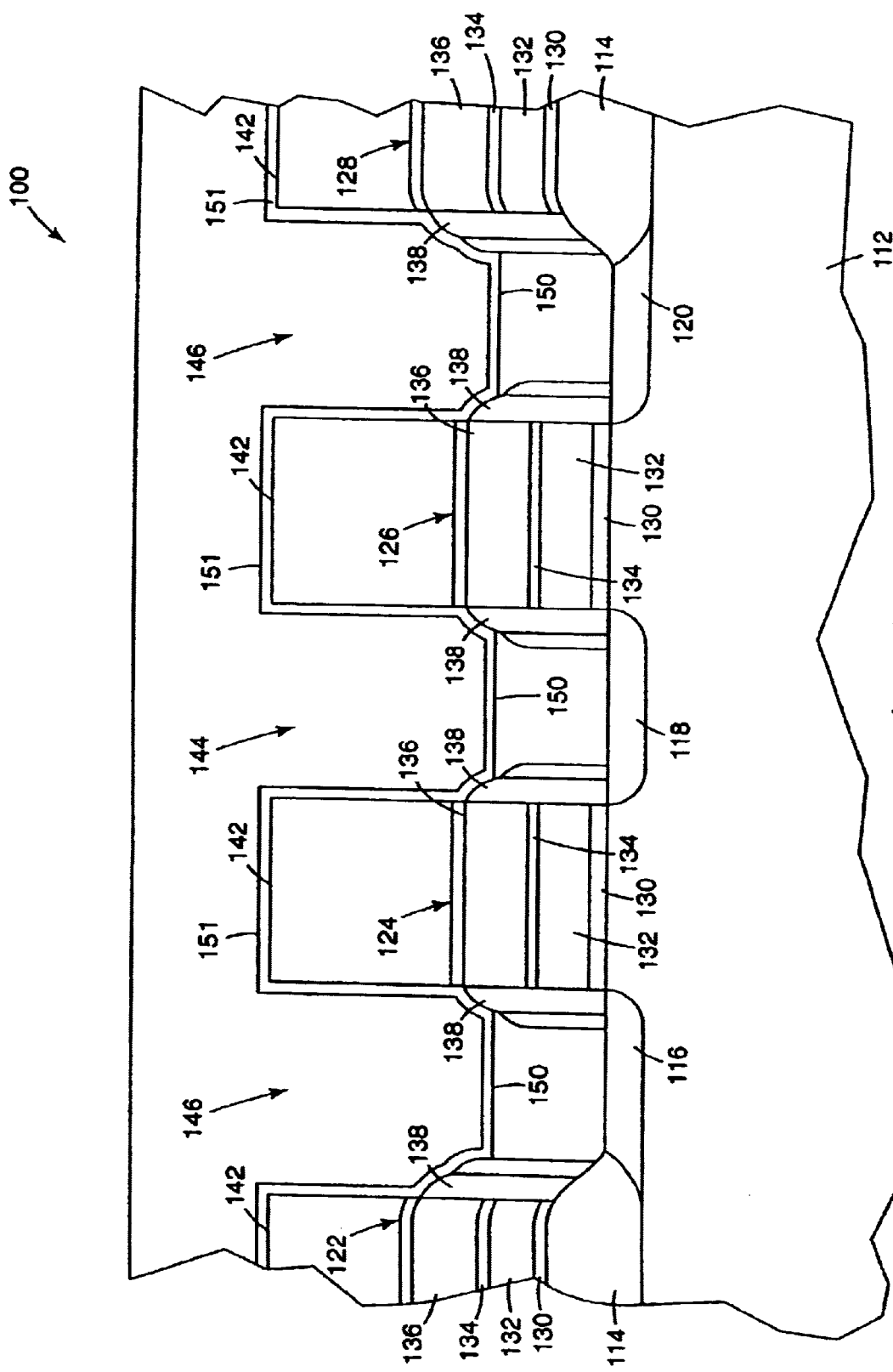
FIG. 9 is a diagrammatic cross-sectional view of a portion of a semiconductor wafer at a processing step subsequent to that shown in FIG. 8.

Referring now to FIG. 9, a thin barrier layer 151 of a Pt—Ir film is formed as a barrier layer atop conductive layer 150. Barrier layer 151 is co-deposited by CVD to form a conformal layer which protects the subsequently deposited capacitor dielectric against diffusion from underlying plug 150 and other surrounding materials. Perhaps more importantly for some applications of the invention, barrier layer 151 also protects the underlying plug 150 from diffusion of oxygen from the capacitor dielectric. Chemical vapor deposition techniques are desired because they are more suitable for deposition on semiconductor substrates or substrate assemblies, particularly in contact openings which are extremely small and require conformally filled layers of metal.

Figure 10:
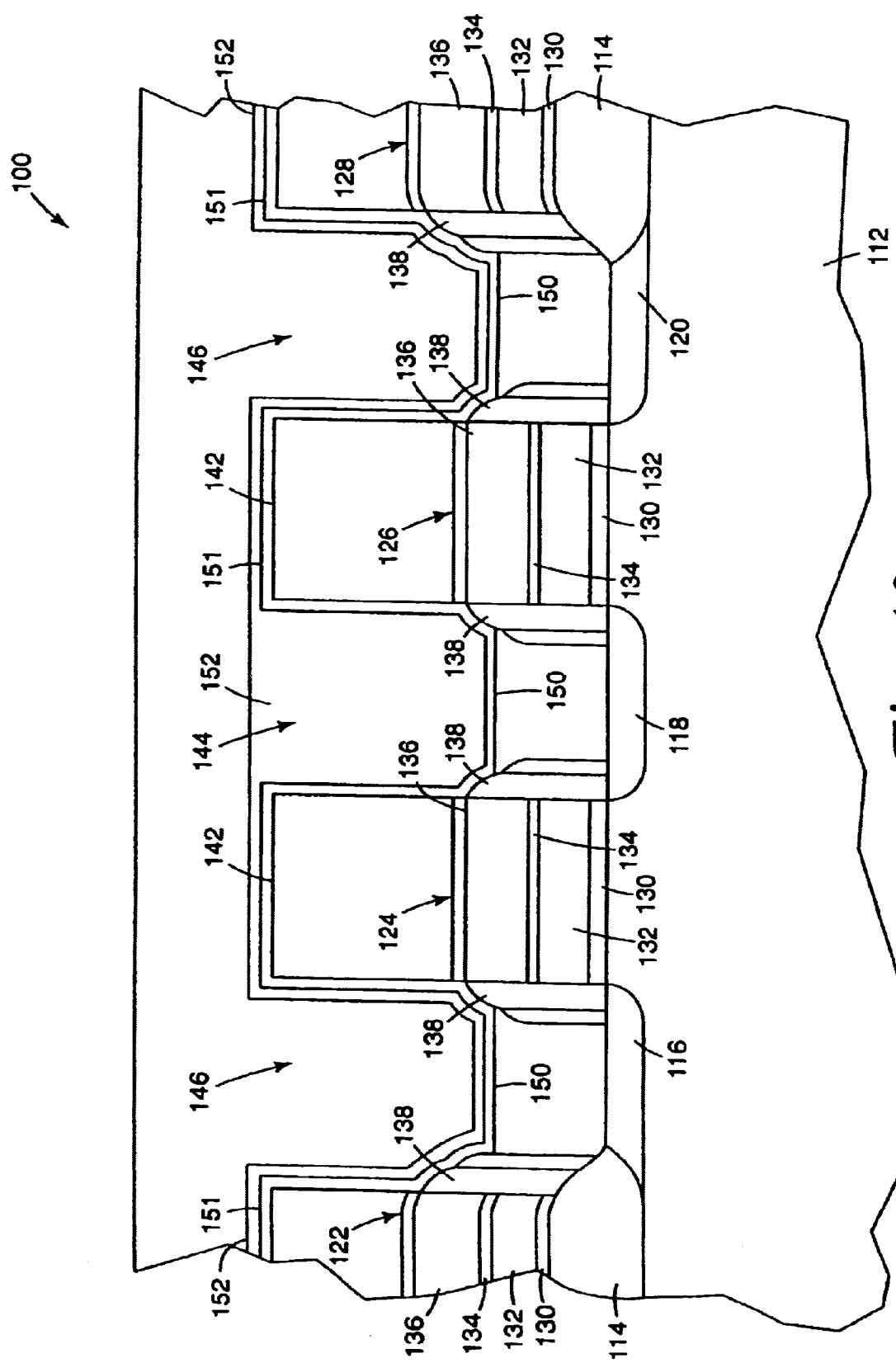
FIG. 10 is a diagrammatic cross-sectional view of a portion of a semiconductor wafer at a processing step subsequent to that shown in FIG. 9.

Following chemical vapor co-deposition of barrier layer 151, a layer 152 of conductive material that will eventually form one of the electrodes of the capacitor is deposited at a thickness such that the capacitor openings 146 are not closed off. Referring to FIG. 10, the layer 152 may be formed of various refractive metals, conductive metal oxides, metal nitrides, noble metals and may include, such as, Pt, Rh, Ir, Ru, Os, Pd, $IrO_2$, $RhO_2$, $RuO_2$, Ta, TiN, TaN, Ti and others. The conductive layer 152 is in electrical contact with the previously formed plugs 150 or, as previously mentioned, the Pt—Ir layer will itself be the lower electrode.

Figure 11:
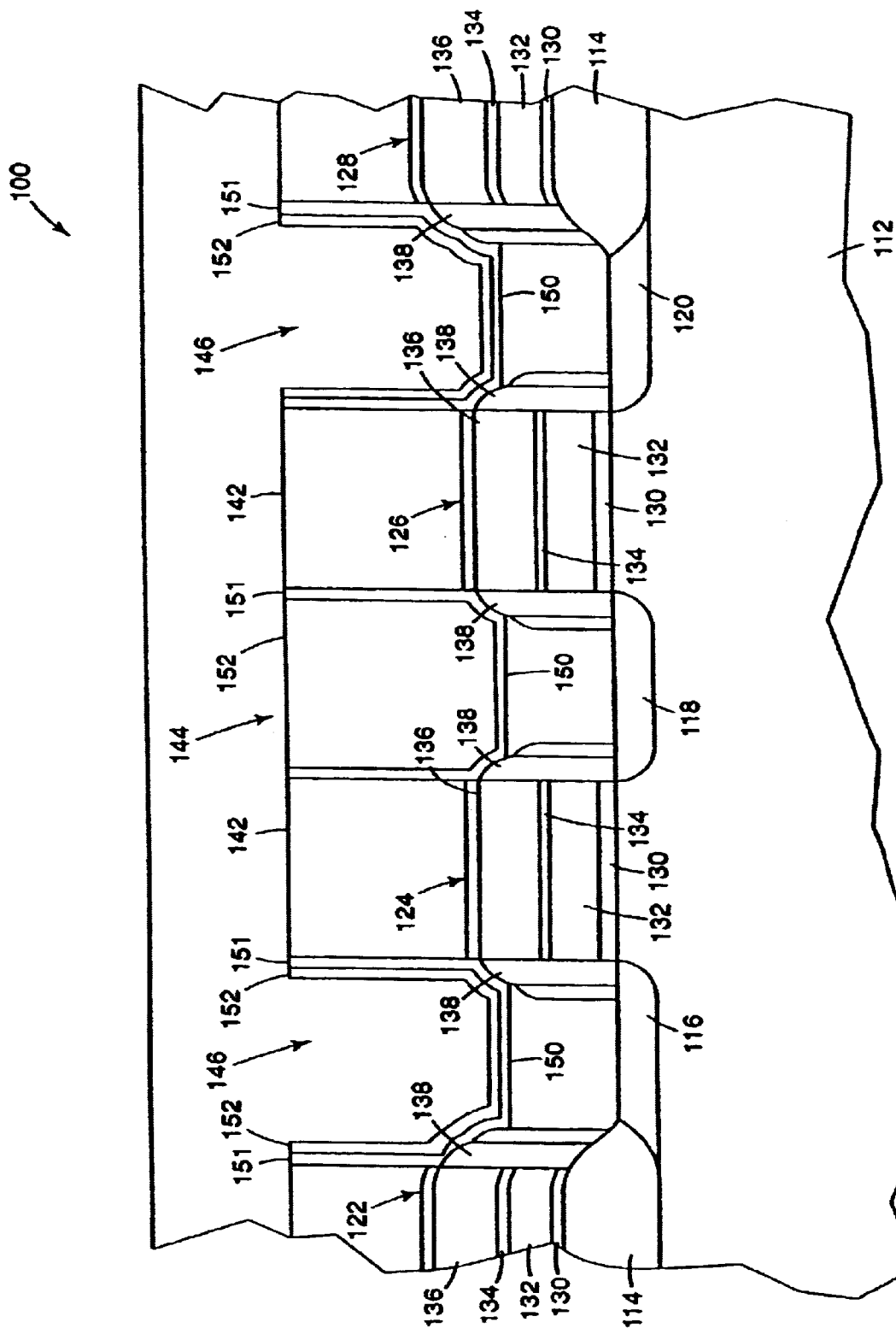
FIG. 11 is a diagrammatic cross-sectional view of a portion of a semiconductor wafer at a processing step subsequent to that shown in FIG. 10.
Figure 12:
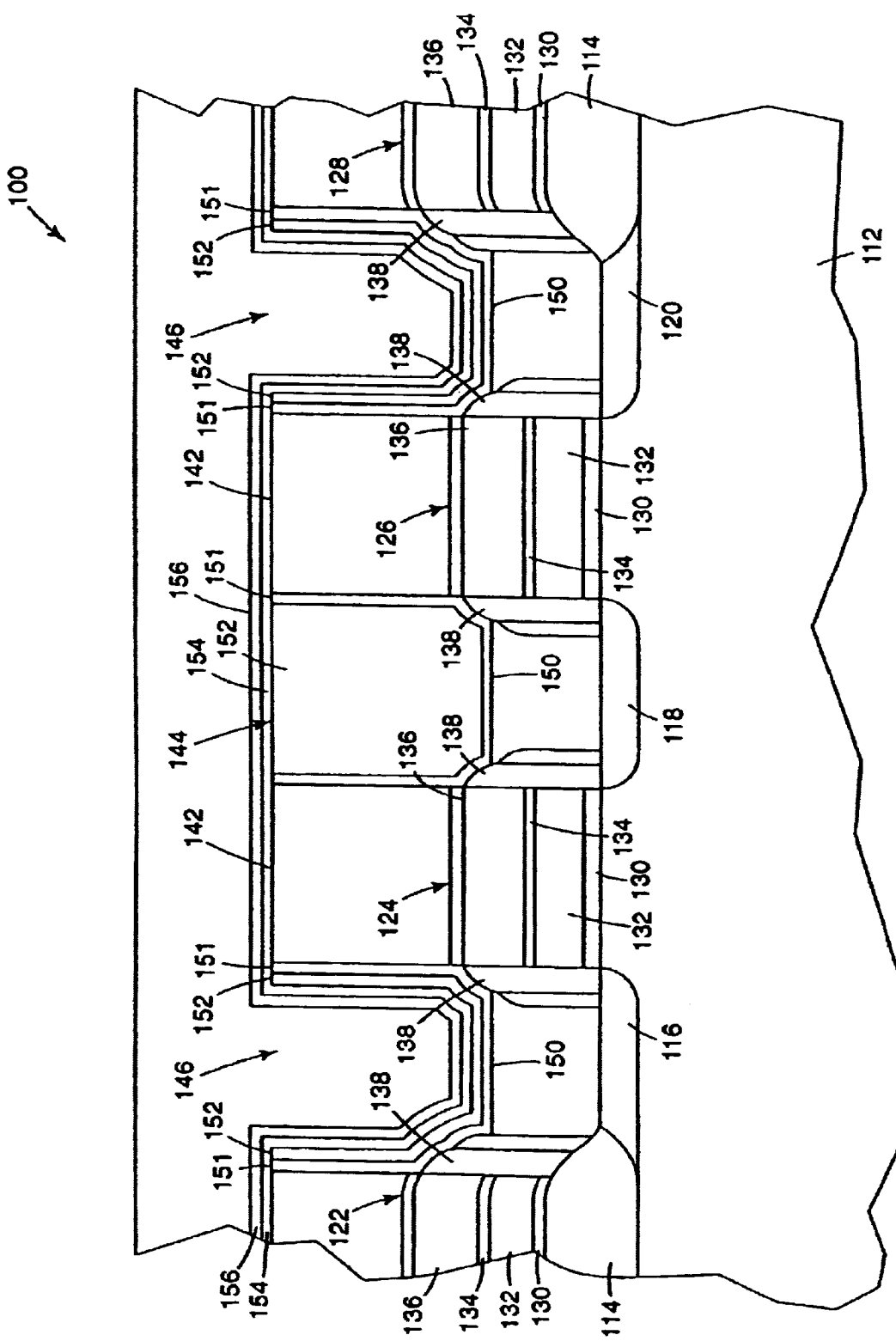
FIG. 12 is a diagrammatic cross-sectional view of a portion of a semiconductor wafer at a processing step subsequent to that shown in FIG. 11.

Referring to FIG. 11, the portion of the conductive layer 152 above the top of the BPSG layer 142 is removed through a planarized etching process, thereby electrically isolating the portions of layer 152 remaining in the bit line contact opening 144 and capacitor openings 146. Referring now to FIG. 12, a capacitor dielectric layer 154 is provided over conductive layer 152 and capacitor openings 146.

Dielectric layer 154 is deposited with a thickness such that the openings 146 are again not completely filled. Dielectric layer 154 may include tantalum pentoxide ($Ta_2O_5$). Other suitable dielectric materials such as Strontium Titanate (ST), Barium Strontium Titanate (BST), Lead Zirconium Titanate (PZT), Strontium Bismuth Tantalate (SBT) and Bismuth Zirconium Titanate (BZT) may also be used. Dielectric layer 154 may be deposited by a low-pressure CVD process using $Ta(OC_2H_5)_5$ and $O_2$ at about 430° C., and may be subsequently annealed in order to reduce leakage current characteristics.

A second conductive electrode layer 156 is then deposited by CVD over the dielectric layer 154, again at a thickness which less than completely fills the capacitor openings 146. The second conductive layer 156 may include TiN, Pt, or other conventional electrode materials, such as many of those previously described for use as conductive layer 152. In addition to serving as the top electrode or second plate of the capacitor, the second conductive layer 156 also forms the interconnection lines between the second plates of all capacitors.

Figure 13:
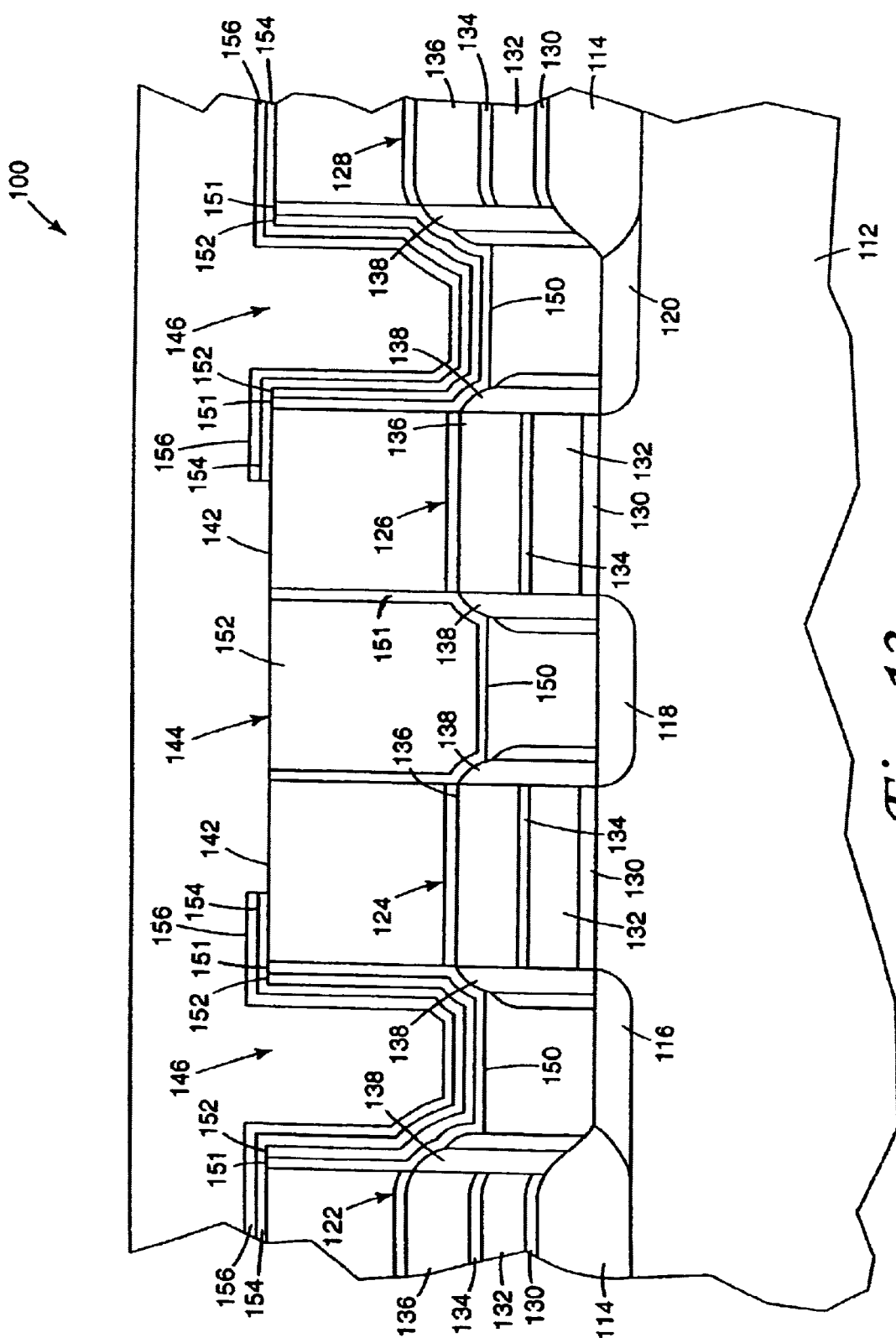
FIG. 13 is a diagrammatic cross-sectional view of a portion of a semiconductor wafer at a processing step subsequent to that shown in FIG. 12.

Referring to FIG. 13, the second conductive layer 156 and underlying capacitor dielectric layer 154 are patterned and etched such that the remaining portions of each group of the first conductive layer 152, capacitor dielectric layer 154, and second conductive layer 156 over the bit line contact opening 144 and capacitor openings 146 are electrically isolated from each other. In this manner, each of the active areas 116, 118, 120 are also electrically isolated (without the influence of the gate). Furthermore, at least a portion of the barrier layer 151 and the first conductive layer 152 in contact with the plug 150 over the bit line active area 118 are outwardly exposed.

Figure 14:
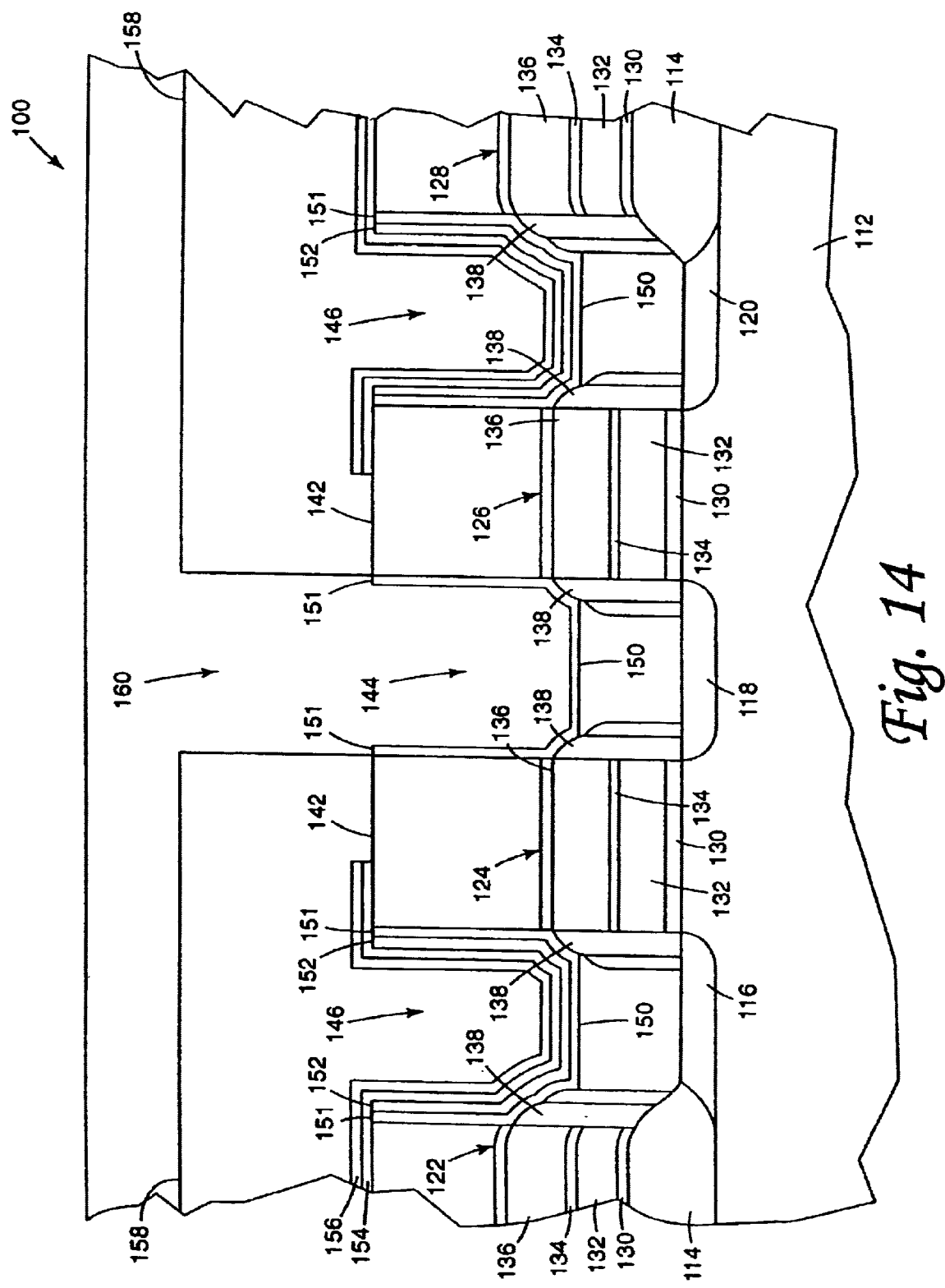
FIG. 14 is a diagrammatic cross-sectional view of a portion of a semiconductor wafer at a processing step subsequent to that shown in FIG. 13.

Referring now to FIG. 14, a bit line insulating layer 158 is provided over the second conductive layer 156. The bit line insulating layer 158 preferably includes BPSG. The BPSG is typically reflowed by conventional techniques, i.e., heating to about 800° C. Other insulating layers such as PSG, or other compositions of doped $SiO_2$ may similarly be employed as the insulating layer 158.

A bit line contact opening 160 is patterned through the bit line insulating layer 158 such that the barrier layer 151 above conductive plug 150 is once again outwardly exposed. Then a bit line contact material is provided in the bit line contact opening 160 such that the bit line contact material is in electrical contact with the outwardly exposed portion of the barrier layer 151 above conductive plug 150. Thus, the plug 150 over the active area 118 common to both FETs acts as a bit line contact. The DRAM array and associated circuitry may then be completed by a variety of well established techniques, such as metalization, and attachment to peripheral circuitry.

The Pt—Ir barrier layer and electrode materials according to the invention also have excellent conductivity, and therefor reduce depletion effects and enhance frequency response. The materials possess excellent barrier properties for protection of cell dielectrics and substrate during oxidation/recrystallization steps for dielectrics and during BPGS reflow and other high temperature steps after capacitor formation. In addition, the Pt—Ir barriers according to the invention also substantially prevent diffusion to protect cell dielectrics from interaction with silicon and other surrounding materials which may degrade the dielectric materials or produce an additional $SiO_2$ dielectric layer; the series capacitance of $SiO_2$ would drastically reduce overall cell capacitance. Thus, the barriers/electrodes of the invention are not limited to use as barrier layers for bottom electrodes, but may also be employed both as top and bottom electrodes, and as additional barrier layers applied to any other top and/or bottom electrodes.

In addition, the use of the platinum and iridium precursor compositions and methods of forming co-deposited Pt—Ir layers of the present invention are beneficial for a wide variety of thin film applications in integrated circuit structures, particularly those using high dielectric materials. For example, such applications include capacitors such as planar cells, trench cells (e.g., double sidewall trench capacitors), stacked cells (e.g., crown, V-cell, delta cell, multi-fingered, or cylindrical container stacked capacitors). The platinum-iridium layers are particularly effective at preventing silicon diffusion and oxygen diffusion.

The advantages of co-depositing Ir with Pt for the barrier layer 151 will now be discussed with references to FIGS. 15–17 in the Examples below.

EXAMPLES

The following examples are offered to further illustrate the various specific and preferred embodiments and techniques. It should be understood, however, that many variations and modifications may be made while remaining within the scope of the present invention.

Synthesis of {(CH$_3$)C$_5$H$_4$}Ir(CO)$_2$

In an inert-atmosphere glove box, a flask was charged with 2.0 g (6.4 mmol) of chlorotricarbonyliridium (I) (Strem Chemicals, Inc., Newburyport, Mass.). The compound was suspended in 100 mL of hexanes and stirred during the addition of a solution of methylcyclopentadienyl lithium (12.8 mL of 0.5 M in THF). The flask was equipped with a condenser and the mixture was refluxed for 24 hours. The solvent was then removed in vacuo. The crude product was purified by vacuum distillation; an orange colored liquid product collected was at 58° C. at approximately 200 mTorr. The product was characterized by IR and NMR spectroscopy.

CVD of a Platinum-Iridium Film

A substrate of silicon that had been thermally oxidized was placed into a CVD chamber and heated to 380° C. A bubbler containing {(CH$_3$)C$_5$H$_4$}Ir(CO)$_2$ was connected such that carrier gas would pass through the liquid precursor and take vapor of the compound into the chamber. The bubbler was heated to 45° C. and the lines connecting the bubbler to the chamber were heated to 55° C. to prevent condensation. A second bubbler containing {(CH$_3$)C$_5$H$_4$}Pt(CH$_3$)$_2$ (MeCpPtMe$_3$), which was obtained from Strem Chemicals, was connected such that carrier gas would pass through the liquid precursor and take vapor of the compound into the chamber. The bubbler was heated to 33° C. and the lines connecting the bubbler to the chamber were heated to 45° C. to prevent condensation. Using a carrier gas flow of 30 sccm He for the platinum precursor and 7 sccm He for the iridium precursor, and a reaction gas flow of 50 sccm N$_2$O, with a platinum precursor bubbler pressure of 3 torr and temperature of 33° C. and an iridium precursor bubbler pressure of 3 torr and temperature of 45° C., and a chamber pressure of 3 torr and deposition temperature of 380° C. at the wafer surface, a film was deposited for 15 minutes. A small lab scale reaction CVD chamber was used with a glass research bubbler, the latter of which was obtained from Technical Glass Service (Boise, Id.).

A depth profile was attained by using an XPS device available under the trade designation of PhI (Φ) 5600 from Physical Electronics (Eden Prairie, Minn.). The operating conditions for obtaining the profile include x-ray source of 350 W, monochromatic Al k$_a$ (hV=1486.6 eV); 45 degree extraction; 800 µm extraction aperture. Sputtering was performed with a 4 keV Argon ion beam rastored over a 3×3 mm area. The sputter time for the depth profile of FIG. 15 was 11 minutes, the sputter time for the depth profile of FIG. 16 was 17 minutes, and the sputter time for the depth profile of FIG. 17 was 45 minutes.

Figure 15:
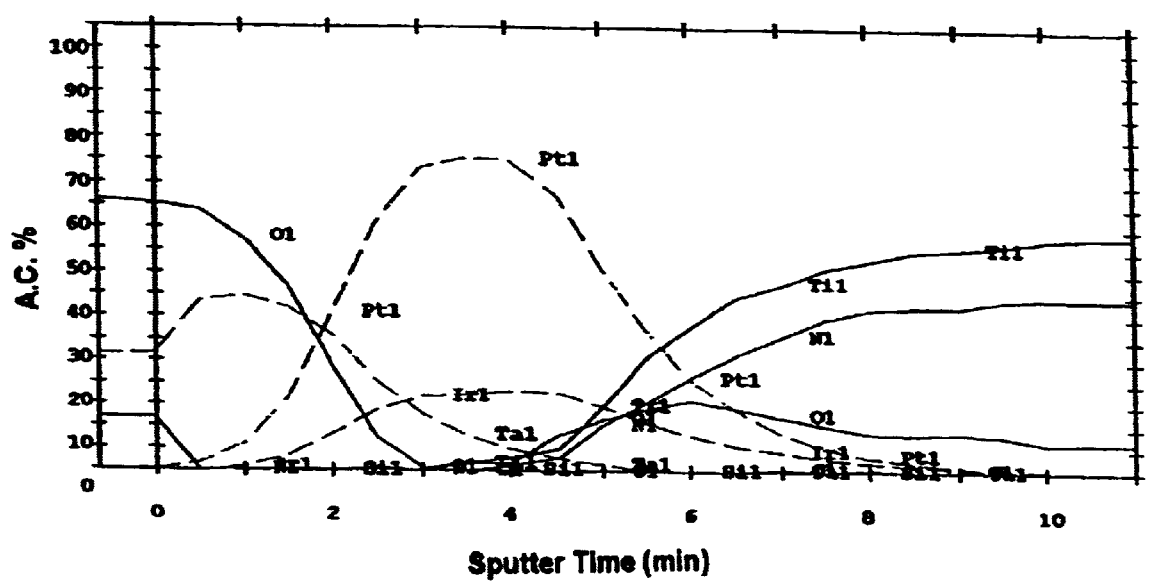
FIG. 15 shows an x-ray photoelectron spectroscopy (XPS) depth profile of co-deposited CVD Pt—Ir layer as deposited.

FIG. 15 shows an XPS depth profile of a Pt—Ir film, produced by CVD co-deposition of Pt and Ir between a layer of Ta$_2$O$_5$ and TiN. The iridium concentration in the Pt—Ir layer is about 25 atom percent.

Figure 16:
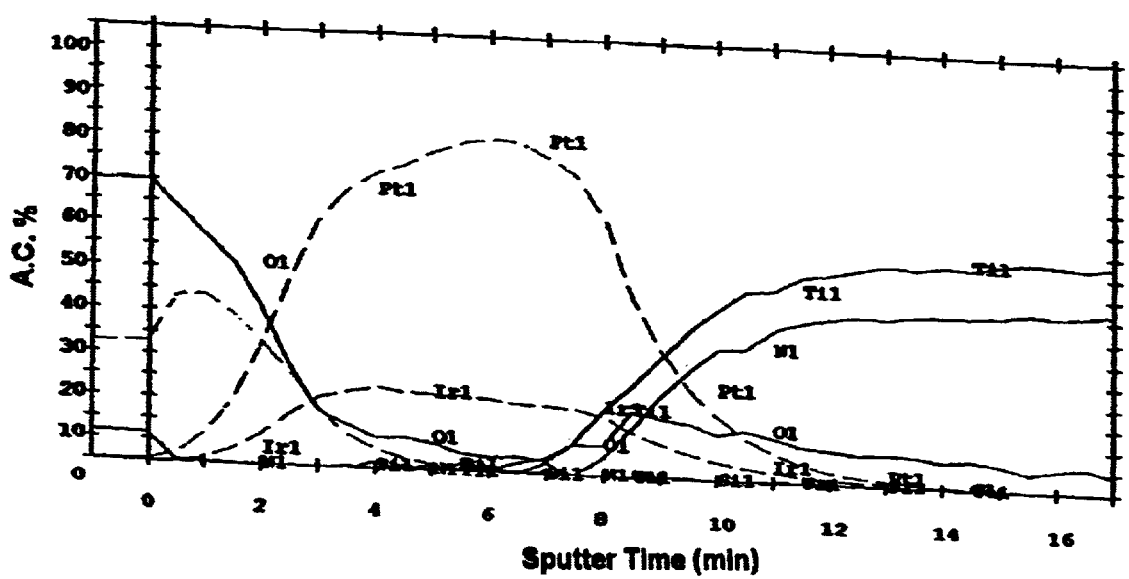
FIG. 16 shows an x-ray photoelectron spectroscopy (XPS) depth profile of co-deposited CVD Pt—Ir layer after rapid thermal oxidation (RTO) at 650° C. for 60 seconds.

FIG. 16 shows an XPS depth profile of a Pt—Ir film, produced by CVD co-deposition of Pt and Ir between a layer of Ta$_2$O$_5$ and TiN (after RTO at 650° C. for 60 seconds) for comparison of oxygen barrier properties. The iridium concentration in the Pt—Ir layer is about 25 atom percent. The Ta$_2$O$_5$ surface had oxygen present at a level of about 65 atom percent, but the underlying TiN layer had only about 10–20 atom percent oxygen present.

Figure 17:
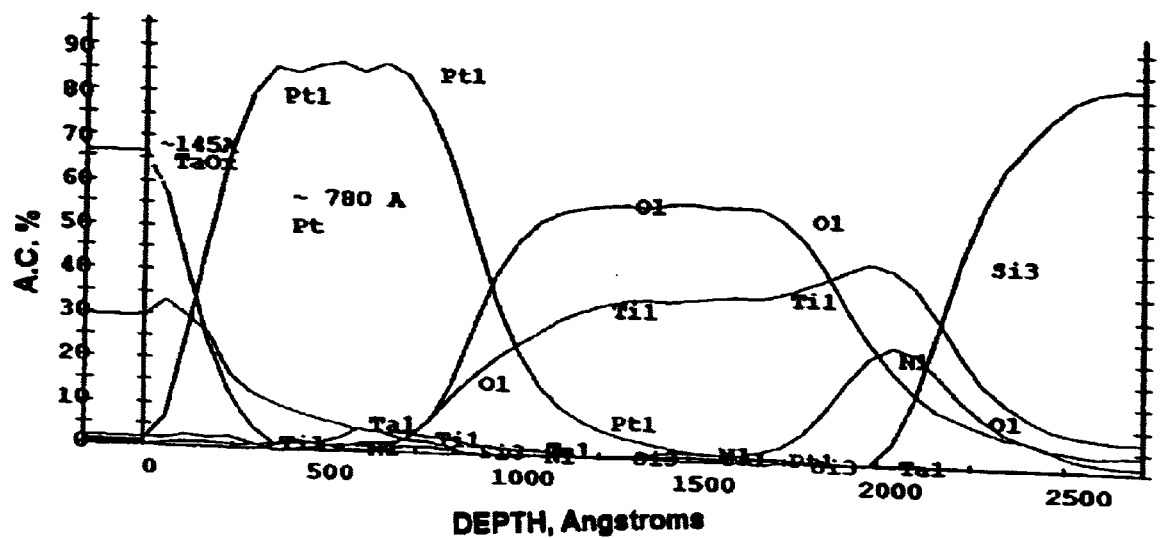
FIG. 17 shows an x-ray photoelectron spectroscopy (YPS) depth profile of co-deposited CVD Pt—Ir layer after annealing at 650° C. for 60 seconds.

FIG. 17 shows an XPS depth profile of a Pt layer, produced by CVD deposition of Pt between a layer of Ta$_2$O$_5$ and TiN, (after annealing at 650° C. for 60 seconds) for comparison of oxygen barrier properties. The Ta$_2$O$_5$ surface had oxygen present at a level of 70 atom percent, but the underlying TiN layer had only about 10–20 atom percent oxygen present, showing little degradation of the as deposited film.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of manufacturing a semiconductor structure, the method comprising:

providing a semiconductor substrate or substrate assembly;

providing a precursor composition comprising one or more complexes of the formula:

$$L_y Ir Y_z,$$

wherein:
each L group is independently a neutral or anionic ligand;
each Y group is independently a pi bonding ligand selected from the group of CO, NO, CN, CS, N$_2$, PX$_3$, PR$_3$, P(OR)$_3$, AsX$_3$, AsR$_3$, As(OR)$_3$, SbX$_3$, SbR$_3$, Sb(OR)$_3$, NH$_x$R$_{3-x}$, and RCN, wherein R is an organic group, X is a halide, and x=0 to 3,
y=1 to 4; and
z=1 to 4;

providing a precursor composition comprising one or more platinum complexes; and forming a platinum-iridium-containing film from the precursor compositions on a surface of the semiconductor substrate or substrate assembly, wherein the platinum-iridium-containing film has the formula platinum(w):iridium(1−w), wherein w is in the range of about 0.99 to about 0.01.

2. The method of claim 1 wherein forming a platinum-iridium-containing film comprises vaporizing the precursor compositions and directing them toward the semiconductor substrate or substrate assembly using a chemical vapor deposition technique.

3. The method of claim 1 wherein the precursor composition comprising one or more complexes of the formula L$_y$IrY$_z$ is the same as the precursor composition comprising one or more platinum complexes.

4. The method of claim 1 wherein the semiconductor substrate is a silicon wafer or a gallium arsenide wafer.

5. The method of claim 1 wherein each R group is a C$_1$–C$_8$ organic group.

6. The method of claim 5 wherein each R group is a C$_1$–C$_5$ organic group.

7. The method of claim 6 wherein each R group is a C$_1$–C$_4$ alkyl moiety.

8. The method of claim 1 wherein the precursor compositions are each liquids.

9. The method of claim 8 wherein the liquid precursor compositions comprise a solid dissolved in a solvent.

10. The method of claim 1 wherein the precursor compositions are vaporized in the presence of a carrier gas.

11. The method of claim 1 wherein the precursor compositions are vaporized in the presence of a reaction gas.

12. The method of claim 11 wherein the platinum precursor composition comprises a platinum complex selected from the group consisting of CpPt(Me)$_3$, wherein Me is a methyl group and Cp is substituted or unsubstituted cyclopentadienyl, Pt(CO)$_2$Cl$_2$, cis-Pt(CH$_3$)$_2$[(CH$_3$)NC]$_2$, (COD)Pt(CH$_3$)$_2$, (COD)Pt(CH$_3$)Cl, (C$_5$H$_5$)Pt(CH$_3$)(CO), (acac)(Pt)(CH$_3$)$_3$, Pt(acac)$_2$, Pt(PF$_3$)$_4$, wherein COD=1,5 cycloctadiene and acac=acetylacetonate, and mixtures thereof.

13. The method of claim 1 wherein w is in the range of about 0.65 to about 0.85.

14. The method of claim 13 wherein w is about 0.75.

15. A method of forming a film on a substrate, the method comprising:

providing a substrate;

providing a precursor composition comprising one or more complexes of the formula:

wherein:
each L group is independently a neutral or anionic ligand;
each Y group is independently a pi bonding ligand selected from the group of CO, NO, CN, CS, N$_2$, PX$_3$, PR$_3$, P(OR)$_3$, AsX$_3$, AsR$_3$, As(OR)$_3$, SbX$_3$, SbR$_3$, Sb(OR)$_3$, NH$_x$R$_{3-x}$, CNR, and RCN, wherein R is an organic group, X is a halide, and x=0 to 3;
y=1 to 4; and
z–1 to 4;

providing a precursor composition comprising one or more platinum complexes; and forming a platinum-iridium-containing film from the precursor compositions on a surface of the substrate, wherein the platinum-iridium-containing film has the formula platinum(w):iridium(1−w), wherein w is in the range of about 0.99 to about 0.01.

16. The method of claim 15 wherein forming a platinum-iridium-containing film comprises vaporizing the precursor compositions and directing them toward the substrate using a chemical vapor deposition technique.

17. The method of claim 16 wherein the platinum precursor composition comprises a platinum complex selected from the group consisting of CpPt(Me)$_3$, wherein Me is a methyl group and Cp is substituted or unsubstituted cyclopentadienyl, Pt(CO)$_2$Cl$_2$, cis-Pt(CH$_3$)$_2$[(CH$_3$)NC]$_2$, (COD)Pt(CH$_3$)$_2$, (COD)Pt(CH$_3$)Cl, (C$_5$H$_5$)Pt(CH$_3$)(CO), (acac)(Pt)(CH$_3$)$_3$, Pt(acac)$_2$, Pt(PF$_3$)$_4$, wherein COD=1,5 cycloctadiene and acac=acetylacetonate, and mixtures thereof.

18. The method of claim 15 wherein w is in the range of about 0.65 to about 0.85.

19. The method of claim 18 wherein w is about 0.75.

* * * * *

UNITED STATES PATENT AND TRADEMARK OFFICE
CERTIFICATE OF CORRECTION

PATENT NO. : 6,660,631 B1
DATED : December 9, 2003
INVENTOR(S) : Eugene P. Marsh It is certified that error appears in the above-identified patent and that said Letters Patent is hereby corrected as shown below:

Column 2,
Line 66, please delete "LylrY$_2$" and insert -- LylrY$_z$ --;

Column 8,
Line 19, please delete "for-use" and insert -- for use --;
Line 49, please delete "composition-can" and insert -- composition can --;

Column 9,
Line 1, please delete "$H_2O$, $H_2O_2$; $O_2$, $O_3$, $N_2O$," and insert -- $H_2O$, $H_2O_2$, $O_2$, $O_3$, $N_2O$, --;
Line 18, please delete "$L_ylr_y$," and insert -- $L_ylrY_{z,}$ --;

Column 12,
Line 23, please delete "10;" and insert -- 10, --;

Column 17,
Line 48, please delete "Al k$_a$" and insert -- Al k$_\alpha$ --;

Column 18,
Line 33, please insert -- CNR -- after "$NH_xR_{3-x}$," and before "and RCN,".

Signed and Sealed this

Twenty-fifth Day of May, 2004

JON W. DUDAS
*Acting Director of the United States Patent and Trademark Office*